(12) United States Patent
Yang et al.

(10) Patent No.: US 6,847,087 B2
(45) Date of Patent: *Jan. 25, 2005

(54) BI-DIRECTIONAL FOWLER-NORDHEIM TUNNELING FLASH MEMORY

(75) Inventors: Ching-Sung Yang, Chang-Hua Hsien (TW); Shih-Jye Shen, Hsin-Chu (TW); Ching-Hsiang Hsu, Hsin-Chu (TW)

(73) Assignee: eMemory Technology Inc., Hsin Chu (TW)

( * ) Notice: Subject to any disclaimer, the term of this patent is extended or adjusted under 35 U.S.C. 154(b) by 175 days.

This patent is subject to a terminal disclaimer.

(21) Appl. No.: 10/065,591

(22) Filed: Oct. 31, 2002

(65) Prior Publication Data

US 2004/0252541 A1 Dec. 16, 2004

(51) Int. Cl.[7] .................. H01L 29/76; H01L 29/94; H01L 31/062; H01L 31/113; H01L 31/119
(52) U.S. Cl. ................ 257/390; 257/315; 257/316; 257/318; 257/390
(58) Field of Search .................. 257/208, 314–316, 257/318, 319, 322, 390, 391

(56) References Cited

U.S. PATENT DOCUMENTS

| | | | |
|---|---|---|---|
| 5,568,421 A | * | 10/1996 | Aritome ................ 365/185.17 |
| 5,717,635 A | | 2/1998 | Akatsu |
| 5,923,587 A | | 7/1999 | Choi |
| 5,990,514 A | * | 11/1999 | Choi et al. ................ 257/315 |
| 6,501,685 B2 | * | 12/2002 | Hsu et al. .............. 365/185.33 |
| 6,504,763 B1 | * | 1/2003 | Yang et al. ............. 365/185.28 |
| 2002/0171101 A1 | * | 11/2002 | Hsu et al. .................... 257/314 |
| 2002/0185673 A1 | * | 12/2002 | Hsu et al. .................... 257/314 |

FOREIGN PATENT DOCUMENTS

| | | |
|---|---|---|
| JP | 06005876 | 1/1994 |
| JP | 08299598 | 10/1996 |

* cited by examiner

*Primary Examiner*—Tom Thomas
*Assistant Examiner*—Jesse A. Fenty
(74) *Attorney, Agent, or Firm*—Winston Hsu

(57) ABSTRACT

A low-voltage nonvolatile memory array includes a cell well of a first conductivity type formed in a substrate; columns of buried bit lines of a second conductivity type formed within the cell well, wherein columns of the buried bit lines are isolated from each other and each is further divided into of sub-bit line segments with deeply doped source wells of the first conductivity type connected to the cell well; a plurality of memory cell blocks serially arranged over one of the columns of buried bit lines, wherein a memory cell block corresponds to a sub-bit line segment, and each memory cell block includes at least one memory transistor having a stacked gate, source, and drain; and a local bit line overlying the memory cell blocks and electrically connected to the drain of the memory transistor via a contact plug short-circuiting the drain and the subjacent buried bit line.

21 Claims, 24 Drawing Sheets

| | $V_{BL}$ | $V_{WL}$ | $V_{SL}$ | $V_{DPW}$ |
|---|---|---|---|---|
| Program | 5V | -10V | Float | 0V |
| Erase | Float | 10V | -8V | -8V |
| Read | 0V | 0V | 1.5V | 0V |

|  | $V_{BL}$ | $V_{WL}$ | $V_{SG}$ | $V_{SL}$ | $V_{DPW}$ |
|---|---|---|---|---|---|
| Program | 5V | -10V | 0V | Float | 0V |
| Erase | Float | 10V | -6V | -8V | -8V |
| Read | 0V | 0V | 5V | 1.5V | 0V |

| | $V_{BL}$ | $V_{WL}$ | $V_{SL}$ | $V_{DPW}$ |
|---|---|---|---|---|
| Program | 5V | -10V | Float | 0V |
| Erase | Float | 10V | -8V | -8V |
| Read | 0V | 4V | 1.5V | 0V |

BI-DIRECTIONAL FOWLER-NORDHEIM TUNNELING FLASH MEMORY

BACKGROUND OF INVENTION

1. Field of the Invention

The present invention relates to a nonvolatile semiconductor memory, and more particularly, to a bi-directional Fowler-Nordheim (FN) write/erase flash memory utilizing a compatible and low-electric consumption operation mode. According to the present invention, high-speed code flash memory and high-density data flash memory can be integrated on a single chip.

2. Description of the Prior Art

Recently, flash electrically erasable programmable read-only memories (EEPROMs) have gained substantial interest as the best solution for electrically rewritable nonvolatile data storage. These semiconductor memories, which have been broadly used on digital products such as digital cameras, cell phones, video game apparatuses, personal digital assistants (PDA), and so on, combine the high integration density and the high programming speed of EPROMs with the higher functionality of EEPROMs by offering electrical in-circuit erasability. In general, flash memories are categorized into NOR cell and NAND cell types. As known in the art, NOR type flash memory can be operated at higher read speeds and is thus suited for code flash, which primarily implements program transformation. NAND type flash memory has a relatively low read speed but higher density so that it is typically used as data flash, which primarily implements data access or data storage.

Please refer to FIG. 1. FIG. 1 is a cross-sectional view illustrating a conventional NAND type EEPROM 10. As shown in FIG. 1, the NAND type EEPROM 10 comprises an N-type semiconductor substrate 12, a P-type semiconductor well 14 located in the semiconductor substrate 12, a plurality of NAND cell blocks ($B_1$, $B_2$~$B_N$) in one column located on the P-type semiconductor well 14, and a local bit line BL1 located over the column of NAND cell blocks ($B_1$, $B_2$~$B_N$). The prior art NAND type EEPROM 10 further comprises another column of NAND cell blocks (not shown) next to the column of NAND cell blocks ($B_1$, $B_2$~$B_N$) of FIG. 1, and both columns of NAND cell blocks are formed on the same (commonly used) P-type semiconductor well 14 having a well depth that is deeper than the depth of STI regions. Each of the NAND cell blocks ($B_1$, $B_2$~$B_N$) comprises a plurality of rewritable NMOS memory transistors ($M_0$~$M_n$) connected in series along a direction of the local bit line BL1. The rewritable NMOS memory transistors ($M_0$~$M_n$) are a stacked gate structure, as known in the art, each having an upper control gate 20 and a lower floating gate 22 for storing charges. Rows of word lines are connected to the control gates 20 of memory transistors ($M_0$~$M_n$). At two opposite ends of each of the NAND cell blocks ($B_1$, $B_2$~$B_N$) are provided a bit line selection transistor SGB and a source line selection transistor SGS, respectively, where one terminal of the bit line selection transistor SGB is electrically connected to the local bit line BL1, and one terminal of the source line selection transistor SGS is electrically connected to a source line SL.

However, the above-mentioned flash memory architecture has a drawback in that it consumes a great deal of electricity during a data program operation, leading to a decreased duration of batteries used in digital products. When implementing a data program operation regarding the prior art NAND type EEPROM 10, by way of example, a high voltage such as 20V is applied on a selected word line, and a high voltage such as 12V is applied to unselected word lines to conduct N channels thereof. Consequently, the prior art NAND type EEPROM 10 has very high power consumption. Furthermore, since high voltages, for example, 20V (for the selected cell) and 12V (for non-selected cells), are required to be applied on the selected and un-selected word lines, the programming speed is decelerated, and corresponding reliability problems such as junction breakdown or over-erase will occur. Moreover, since the operation mode of the prior art NAND flash is different from the operation mode of conventional NOR flash, it is difficult to integrate both types of memories onto a single chip. This is because NAND-type data flash memory utilizes a Fowler-Nordheim (FN) tunneling mechanism to implement data programming, while the NOR-type code flash utilizes a hot-carrier injection mechanism to implement data programming. In addition, the prior art flash memory occupies more chip area, thus more costly.

SUMMARY OF INVENTION

Accordingly, it is the primary objective of the claimed invention to provide a low-energy consumption nonvolatile memory, which is operated at relatively low voltages, thereby prolonging duration of batteries of portable electric apparatuses.

It is another objective of the claimed invention to provide an electrically erasable programmable read-only memory (EEPROM) that occupies smaller chip area and can be operated by using a reliable operation mode without the fear of over-erasing.

It is still another objective of the claimed invention to provide an EEPROM capable of integrating high-density NAND flash memory and low-density/high-speed NOR flash memory on a single chip.

It is still another objective of the claimed invention to provide an EEPROM comprising a unique isolated buried local bit line and capable of implementing bi-directional FN write/erase operations.

It is yet another objective of the claimed invention to provide an integrated single chip combining BiAND-type EEPROM with 2T-BiNOR EEPROM and having compatible operation (erase/write/read) modes.

In accordance with the above objectives, the claimed invention is addressed to a specific low-voltage nonvolatile memory array comprising: a substrate, a cell well of a first conductivity type formed in the substrate, and columns of buried bit lines of a second conductivity type formed within the cell well. The columns of the buried bit lines are isolated from each other and each of which is further divided into plurality of sub-bit line segments with deeply doped source wells of the first conductivity type connected to the cell well. A plurality of memory cell blocks are serially arranged over one of the columns of buried bit lines, wherein a memory cell block corresponds to a sub-bit line segment, and each of the memory cell blocks comprises at least one memory transistor having a stacked gate, a source, and a drain. A local bit line overlies the memory cell blocks and is electrically connected to the drain of the memory transistor via a contact plug short-circuiting the drain and the subjacent buried bit line thereof.

In accordance with one feature of the claimed invention, a nonvolatile memory device comprises: a substrate, a cell well of a first conductivity type formed in the substrate, columns of buried bit lines of second conductivity type formed within the cell well. The columns of the buried bit lines are isolated from each other and each of which is further divided into plurality of sub-bit line segments with deeply doped source wells of the first conductivity type connected to the cell well of first conductivity type. A plurality of memory cell blocks are serially arranged over one of the columns of buried bit lines, wherein a memory cell block corresponds to a sub-bit line segment, and each of the memory cell blocks comprises at least one memory transistor having a control gate, a floating gate, a source, and a drain. The nonvolatile memory device of this invention further comprises rows of word lines, each of which connects to the control gate of one of the memory transistors. A local bit line overlies the memory cell blocks and electrically connected to the drain of the memory transistor via a contact plug short-circuiting the drain and the subjacent buried bit line. The nonvolatile memory device of this invention further comprises columns of main bit lines. The columns of the buried bit lines are isolated from each other with shallow trench isolations.

According to one preferred embodiment of the claimed invention, the deeply doped source well of first conductivity type serves as the source of the memory transistor. According to another preferred embodiment of the claimed invention, the memory cell block further comprises a selection transistor having one end serially connected to the source of the memory transistor and the deeply doped source well serves as a source of the selection transistor. According to yet another embodiment of the claimed invention, each of the memory cell blocks comprises a plurality of memory transistors serially connected to each other to form a NAND memory cell array.

Other objects, advantages, and novel features of the claimed invention will become more clearly and readily apparent from the following detailed description when taken in conjunction with the accompanying drawings.

DETAILED DESCRIPTION

Figure 1:
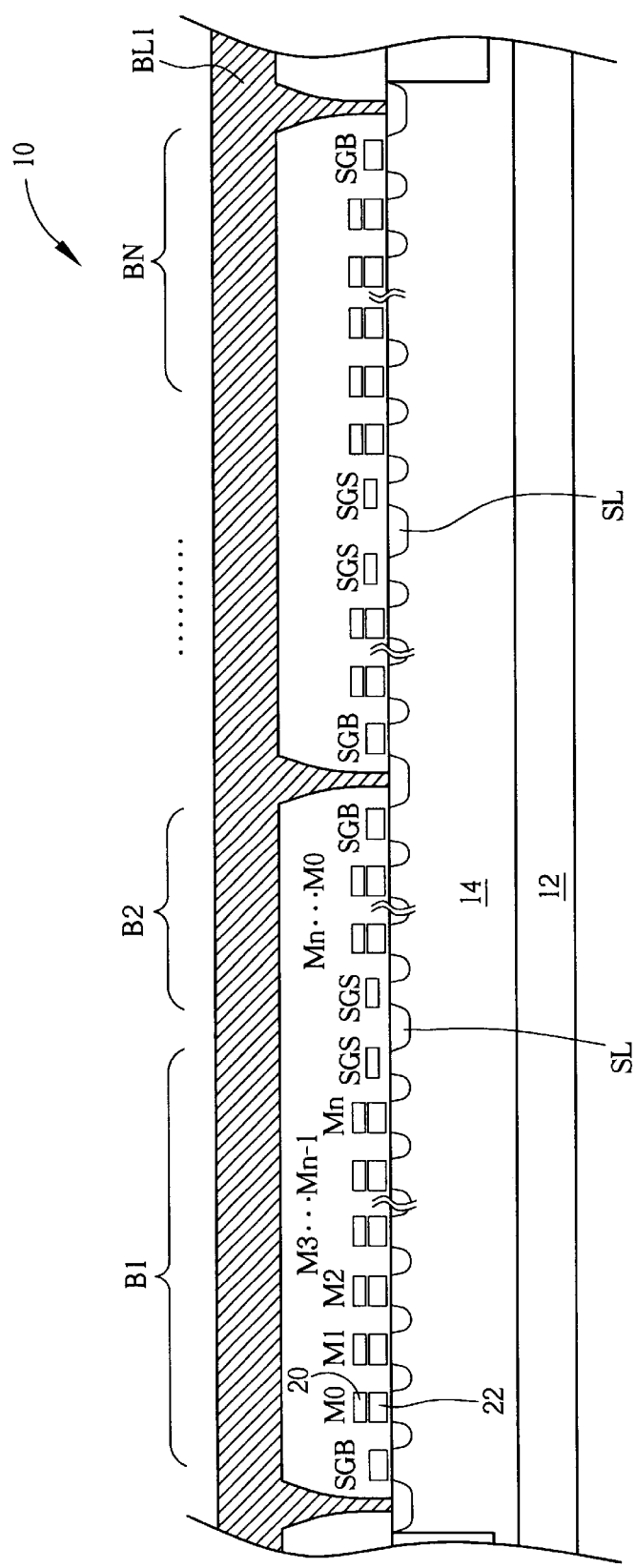
FIG. 1 is a cross-sectional view illustrating a conventional NAND type EEPROM.
Figure 2:
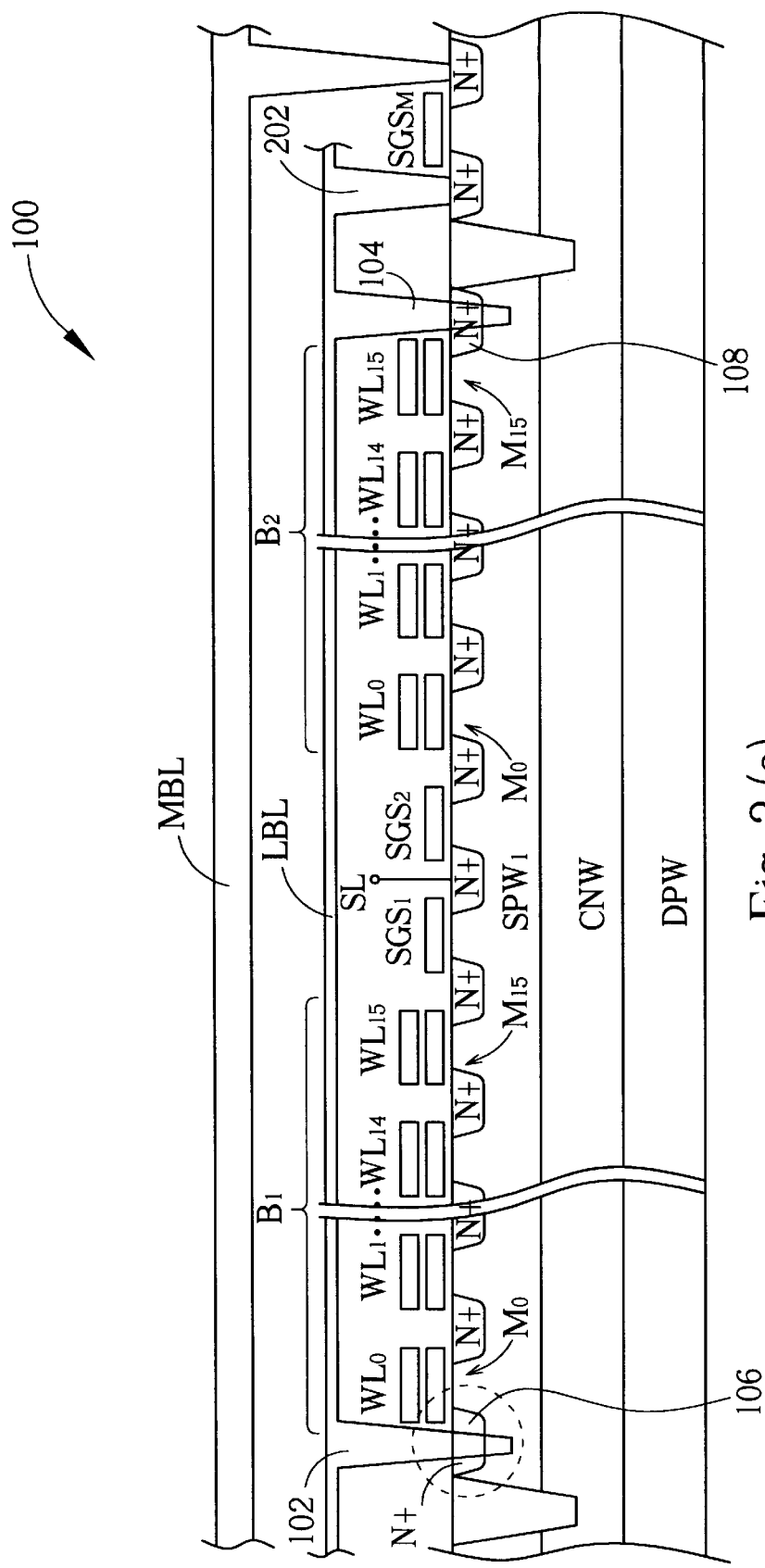
FIG. 2(a) is a cross-sectional schematic diagram showing a portion of an EEPROM according to the first preferred embodiment of this invention.
FIG. 2(b) is an enlarged top view of the memory layout EEPROM of FIG. 2(a).
FIG. 2(c) is a cross-sectional view along line AA" of FIG. 2(b).
Figure 2:
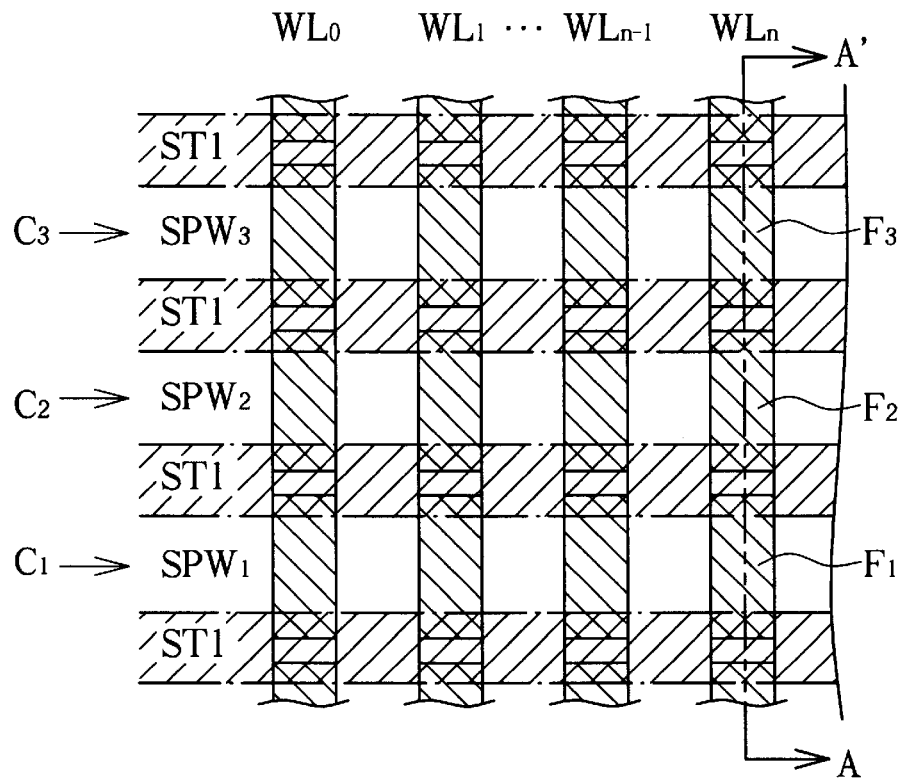
Figure 2:
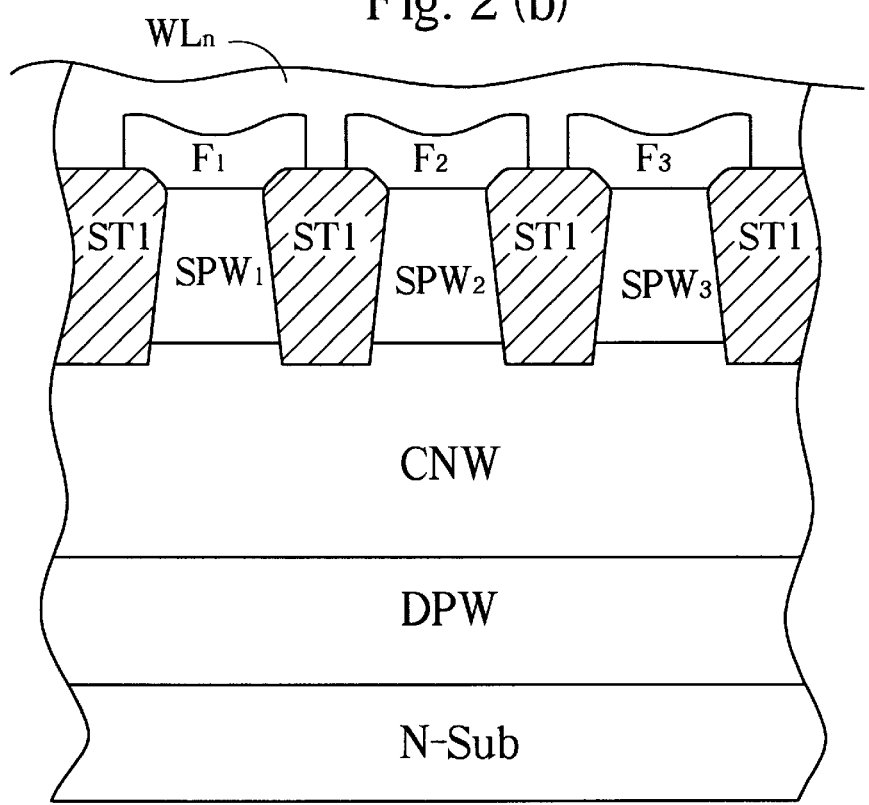

Referring to FIG. 2(a), a portion of an EEPROM 100 is shown in a cross-sectional view according to the first preferred embodiment of this invention in which only two series connected NAND memory cell blocks $B_1$ and $B_2$ are illustrated for the sake of simplicity. As shown in FIG. 2(a), the EEPROM 100, which is based on a novel low-voltage bi-directional FN write/erase NAND type flash memory array architecture, comprises a deep P-well (hereinafter referred to as "DPW"), a cell N-well (hereinafter referred to as "CNW"), a plurality of columns of shallow P-wells (hereinafter referred to as "SPW"). Each of the plural columns of shallow P-wells, which serve as a buried local bit line during operations, is isolated from each other with shallow trench isolation (STI) regions, which are not explicitly denoted in FIG. 2(a). To isolate the shallow P-wells from each other, the thickness of the STI layer is greater than the well depth of the shallow P-wells. It is understood that only one of columns of parallel shallow P-wells is illustrated, that is, $SPW_1$, on which a plurality of NAND cell blocks series connected in one column are formed, as specifically indicated in FIG. 2(a). A local bit line (hereinafter referred to as "LBL") overlies the column of NAND cell blocks. It is understood that between the B1 and B2 cell blocks, it is also possible to insert (n−2) additional memory cell blocks, where in a practical case, by way of example, n=16.

Still referring to FIG. 2(a), each of the NAND memory cell blocks $B_1$ and $B_2$ comprises a plurality of floating gate memory cells ($M_0$~$M_{15}$) connected in series manner. That is to say, according to the first preferred embodiment of the present invention, there are sixteen memory transistors or memory cells ($M_0$~$M_{15}$) for each of the NAND memory cell blocks $B_1$ and $B_2$. Each of the memory cells ($M_0$~$M_{15}$) has a stacked gate structure, i.e., upper word lines ($WL_0$~$W_{15}$) and floating gates. Since this invention does not specifically emphasize the structure of the memory cell units, detailed discussion on it will therefore be omitted. A source line selection transistor (SGS1) is disposed at one end of the NAND cell block $B_1$. The SGS1 has one terminal electrically connected to the source of the NMOS memory transistor $M_{15}$ of the NAND cell block $B_1$ and another terminal electrically connected to a source line (SL) for controlling read signals. At the other end of the NAND cell block $B_1$, a contact plug 102 is electrically connected with a drain 106 of the NMOS memory transistor $M_0$ of the NAND cell block $B_1$. As specifically indicated in the circle region of FIG. 2(a), the contact plug 102 penetrates a junction of the drain 106 and the underlying buried bit line $SPW_1$, thereby short-circuiting the drain 106 and the subjacent buried bit line $SPW_1$. The contact plug 102 is electrically connected to an overlying local bit line (LBL). Via a contact plug 202, LBL is electrically connected to one terminal of a main bit line selection transistor ($SGB_M$), which serves as a switch for controlling signals transferred from a main bit line (MBL) to the LBL. Likewise, a source line selection transistor (SGS2) is disposed at one end of the NAND cell block $B_2$. The SGS2 has one terminal electrically connected to the source of the NMOS memory transistor $M_0$ of the NAND cell block $B_2$ and another terminal electrically connected to the source line (SL). At the other end of the NAND cell block $B_2$, a contact plug 104 is electrically connected with a drain 108 of the NMOS memory transistor $M_{15}$ of the NAND cell block $B_2$. The contact plug 104 penetrates a junction of the drain 108 and the underlying buried bit line $SPW_1$, thereby short-circuiting the drain 108 of the memory transistor $M_{15}$ and the subjacent buried bit line $SPW_1$.

Please refer to FIG. 2(b) and FIG. 2(c), where FIG. 2(b) is an enlarged top view of the memory layout EEPROM 100 of FIG. 2(a) and FIG. 2(c) is a cross-sectional view along line AA" of FIG. 2(b). As mentioned, the EEPROM 100 of the present invention comprises a plurality of columns of serially connected NAND cell blocks ($C_1$, $C_2$, $C_3$) and each column of cell blocks is formed on an associated SPW ($SPW_1$, $SPW_2$, $SPW_3$) which is isolated with STI regions. As most clearly shown in FIG. 2(c), each of the memory cells of one NAND cell block has a stacked gate structure, i.e., upper word lines ($WL_n$) and floating gates ($F_1$, $F_2$, $F_3$). According to one embodiment of this invention, the DPW is formed over an N-type semiconductor substrate.

Figure 3:
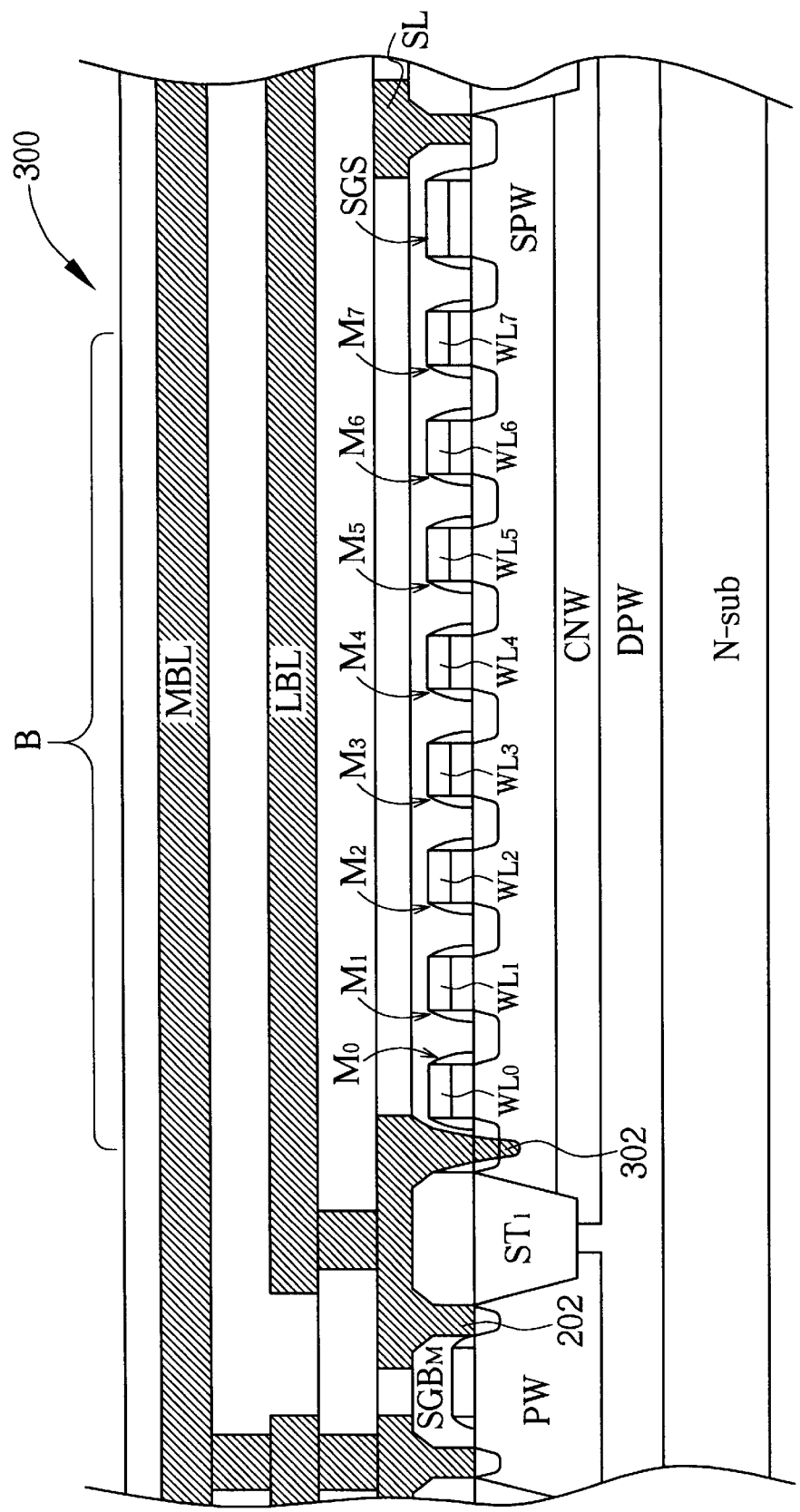
FIG. 3(a) is a cross-sectional schematic diagram showing an EEPROM according to the second preferred embodiment of the present invention
FIG. 3(b) is a corresponding equivalent circuit of FIG. 3(a).
Figure 3:
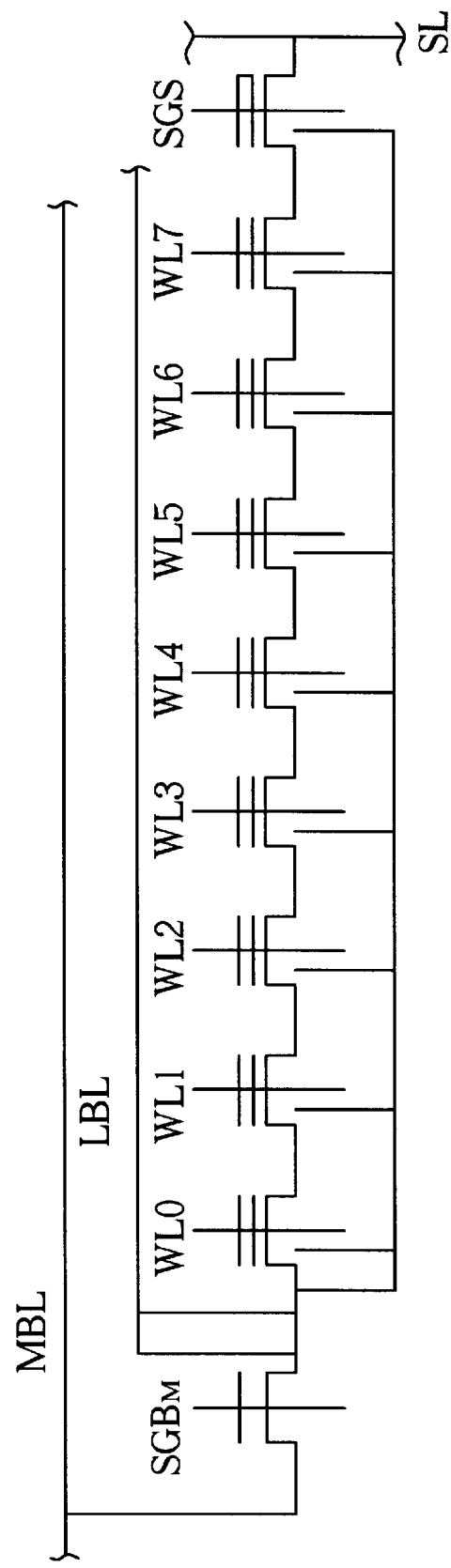

Referring to FIG. 3(a) and FIG. 3(b), an EEPROM 300 in a cross-sectional view and corresponding equivalent circuit according to the second preferred embodiment of the present invention are illustrated. As shown in FIG. 3(a), the EEPROM 300, which is also based on a novel low-voltage bi-directional FN write/erase NAND (BiAND) type flash memory array architecture, comprises a DPW formed on an N-substrate, a CNW formed on the DPW, columns of isolated SPW formed within the CNW, a NAND memory cell block B formed on the SPW, and a local bit line LBL overlying the NAND memory cell block B. The NAND memory cell block B comprises a plurality of serially connected floating gate memory cells ($M_0$~$M_7$). That is to say, according to the second preferred embodiment of the present invention, there are eight memory transistors or memory cells ($M_0$~$M_7$) for the NAND memory cell block B. Each of the memory cells ($M_0$~$M_7$) has a stacked gate structure, i.e., upper word lines ($WL_0$~$WL_7$) and floating gates. A source line selection transistor (SGS) is disposed at one end of the NAND cell block B. The SGS has a stacked gate structure similar to the memory cells, but the control gate and the floating gate of the SGS are electrically connected. The SGS has one terminal electrically connected to the source of the NMOS memory transistor $M_7$ of the NAND cell block B and another terminal electrically connected to a source line (SL) for controlling read signals. At the other end of the NAND cell block B, a contact plug 302 is electrically connected with a drain of the NMOS memory transistor $M_0$ of the NAND cell block B. The contact plug 302 penetrates a junction of the drain and the underlying SPW, thereby short-circuiting the drain of the memory cell $M_0$ and the subjacent SPW. The contact plug 302 is electrically connected to the overlying LBL. Via a contact plug 202, LBL is electrically connected to one terminal of a main bit line selection transistor ($SGB_M$), which serves as a switch for controlling signals transferred from a main bit line (MBL) to the LBL.

As shown in FIG. 3(b), the control gate of the SGS is electrically connected to the floating gate thereof. The $SGB_M$ controls main bit line (MBL) signals and the SGS controls source line (SL) signals. With such configuration, the EEPROM 300 is capable of implementing unique low-voltage FN write/erase operations by virtue of the use of buried local bit lines (isolated SPW).

Figure 4:
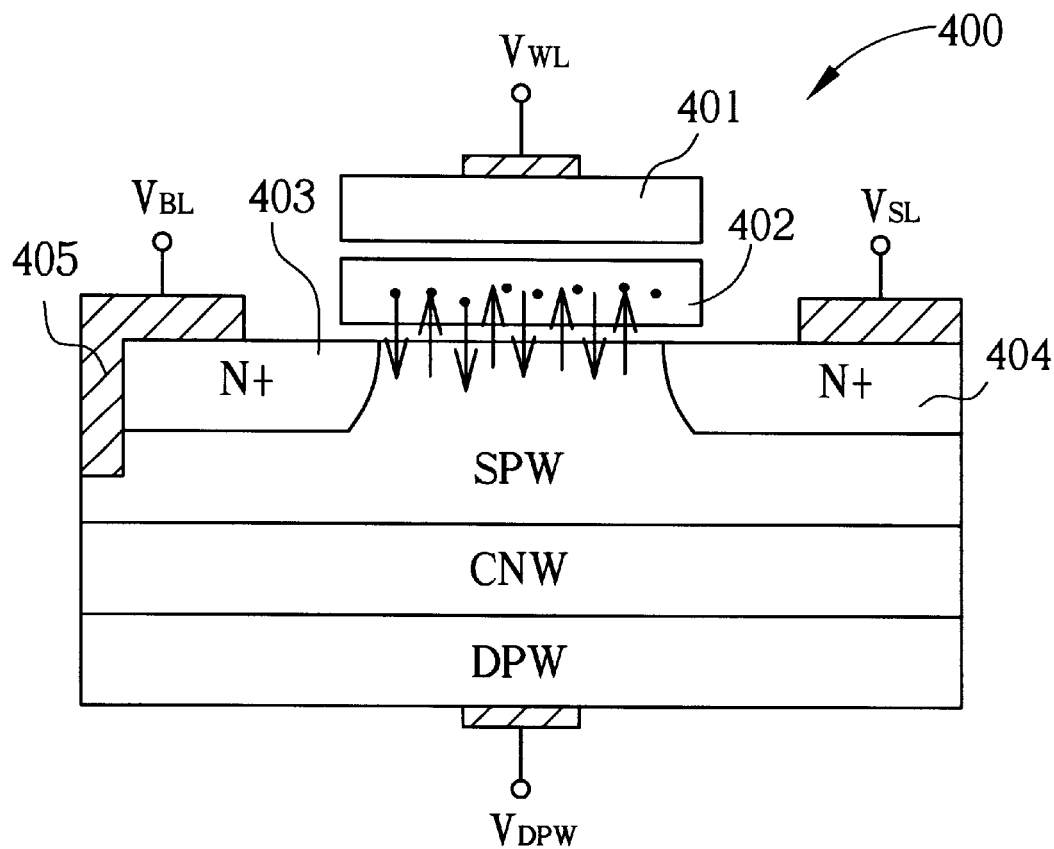
FIG. 4(a) is a cross-sectional schematic diagram illustrating a selected memory cell among a NAND cell block according to this invention
FIG. 4(b) is a table listing, by way of example, all operation parameters when operating the selected memory cell in FIG. 4(a).

Referring to FIG. 4(a) and FIG. 4(b), where FIG. 4(a) is a cross-sectional schematic diagram illustrating a selected memory cell among a NAND cell block according to this invention and FIG. 4(b) is a table listing, by way of example, all operation parameters when operating the selected memory cell in FIG. 4(a). As mentioned, according to the present invention, the NAND memory cells are formed on an isolated SPW, which serves as a buried bit line. The LBL is electrically connected to the SPW through a contact plug that penetrates into the substrate. Such memory structure, which is named as BiAND-EEPROM by the inventors, is capable of implementing desirable low-voltage FN tunneling write/erase operations. As shown in FIG. 4(a), in operation, a word line voltage $V_{WL}$ is applied to the control gate 401 of the memory cell 400, a bit line voltage $V_{BL}$ is applied to the drain 403, a source line voltage $V_{SL}$ is applied to source 404, and a well voltage $V_{DPW}$ is applied to DPW. Since the SPW and the drain 403 are short-circuited together, the voltage of the SPW and the voltage of the drain 403 are the same. The floating gate 402 is floating. As shown in FIG. 4(b), during an erase operation, $V_{BL}$ is floating, $V_{WL}$=10V, $V_{SL}$=-8V, $V_{DPW}$=-8V. Under this condition, electrons are injected into and trapped in the floating gate 402 by FN tunneling through an oxide layer between the floating gate 402 and the SPW, thereby adjusting the memory cell 400 to a higher threshold voltage (higher $V_{TH}$) state, for example, in a range like 1.5V<$V_{TH}$<3.5V. When implementing a write or program operation, $V_{BL}$=5V, $V_{WL}$=-10V, $V_{SL}$ is floating, $V_{DPW}$=0V. Under this condition, trapped electrons in the floating gate 402 are repelled out by FN tunneling, thereby adjusting the memory cell 400 to a lower threshold voltage (lower $V_{TH}$) state, for example, in a range like $V_{TH}$<-1V. When implementing a read operation, $V_{BL}$=0V, $V_{WL}$=0V, $V_{SL}$=1.5V, $V_{DPW}$=0V.

Figure 5A:
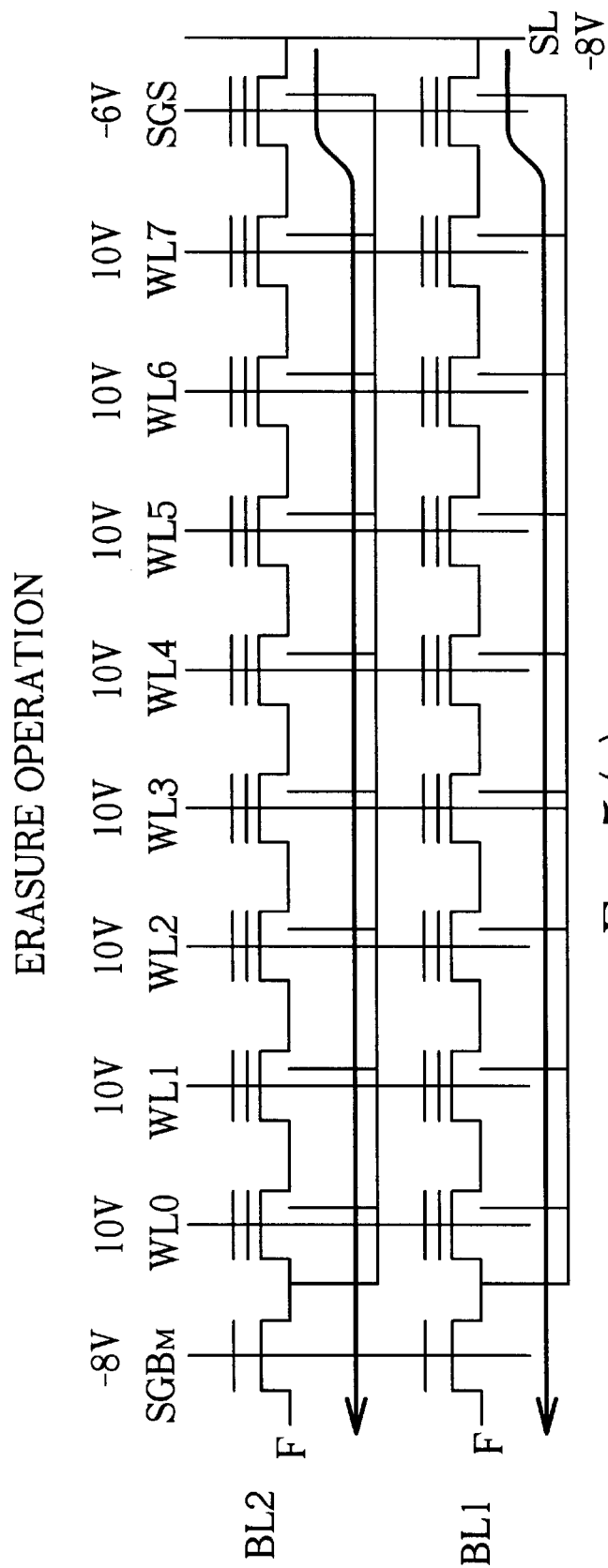
FIG. 5(a) to FIG. 5(c) are a segmental circuit arrangement of the BiAND-EEPROM and exemplary operation modes thereof (erase, program, and read operations, respectively) according to the first preferred embodiment of this invention.
Figure 5:
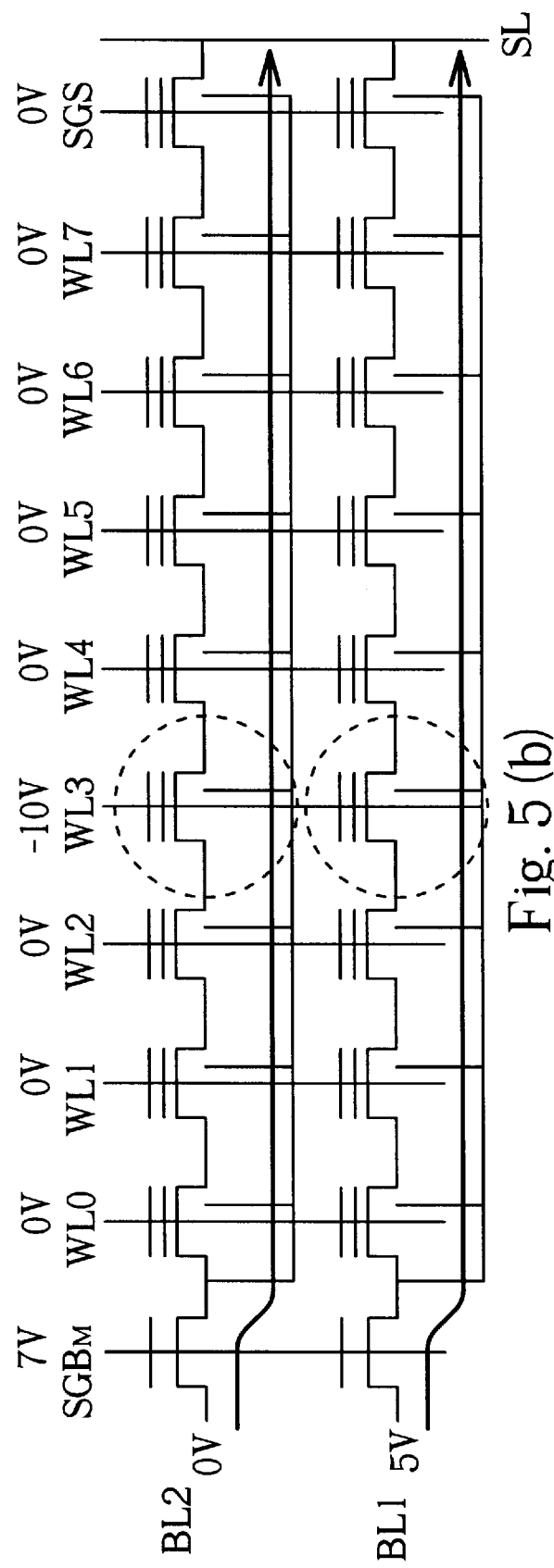
Figure 5:
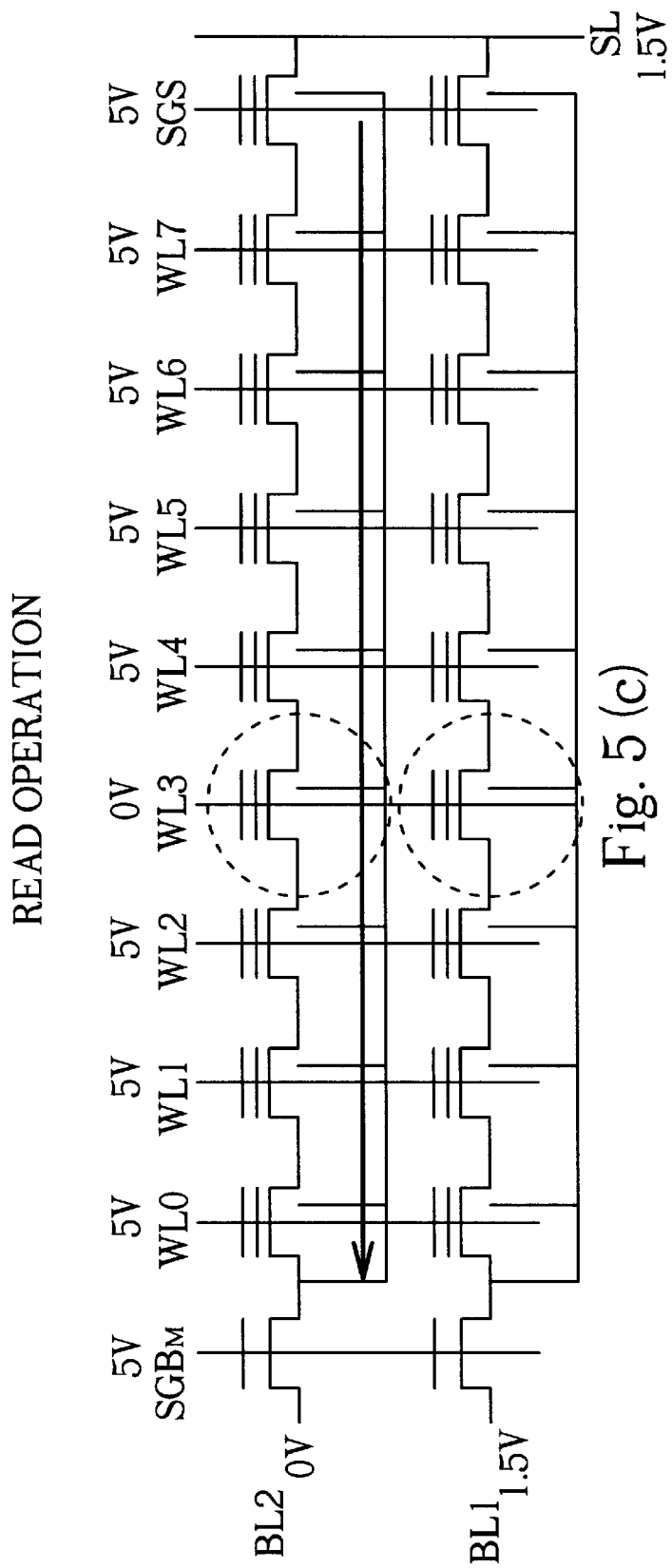

Referring to FIG. 5(a) to FIG. 5(c), a segmental circuit arrangement of the BiAND-EEPROM and exemplary operation modes thereof (erase, program, and read operations, respectively) are shown according to the first preferred embodiment of this invention. As shown in FIG. 5(a), during an erase operation, all of the word lines $WL_0$~$WL_7$ are applied with a word line voltage of 10V, and $V_{PDW}$=-8V. All of the bit lines (only $BL_1$ and $BL_2$ are shown) are floating. Source lines (SL) are applied with a source line voltage of 8V. A gate voltage of 6V is applied to the control gate of the source line selection transistor SGS. Under this condition, electrons are injected into the floating gates of all of the flash memory cells through a so-called FN tunneling mechanism so as to adjust the threshold voltage ($V_{TH}$) of each of the memory cells to a relatively high $V_{TH}$ state, preferably, in a range of $1.5V<V_{TH}<3.5V$.

As shown in FIG. 5(b), during a data program or data write operation, a word line voltage of 10V is applied to the control gate of a selected word line $WL_3$, by way of example. A word line voltage of 0V is applied to the non-selected word lines, i.e., $WL_0 \sim WL_2$ and $WL_4 \sim WL_7$ within the NAND cell block, and $V_{PDW}=0V$. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. A gate voltage of 0V is applied to the control gate of the source line selection transistor SGS. Under this condition, electrons are repelled out of the floating gate of the selected flash memory cell through the FN tunneling mechanism so as to adjust the threshold voltage ($V_{TH}$) of each of the memory cells to a relatively low $V_{TH}$ state, preferably, $V_{TH}<-1V$.

As shown in FIG. 5(c), during a data read operation, a word line voltage of 0V is applied to the control gate of a selected word line $WL_3$, by way of example. A word line voltage of 5V is applied to those non-selected word lines, i.e., $WL_0 \sim WL_2$ and $WL_4 \sim WL_7$ within the NAND cell block so as to conduct channels thereof. A source line voltage of 1.5V is applied to the source lines (SL). A bit line voltage of 0V is applied to a selected bit line $BL_2$. A bit line voltage of 1.5V is applied to those non-selected bit lines (only one non-selected bit line ($BL_1$) is shown). A gate voltage of 5V is applied to the control gate of the bit line selection transistor SGB. A gate voltage of 5V is applied to the control gate of the source line selection transistor SGS.

Figure 6:
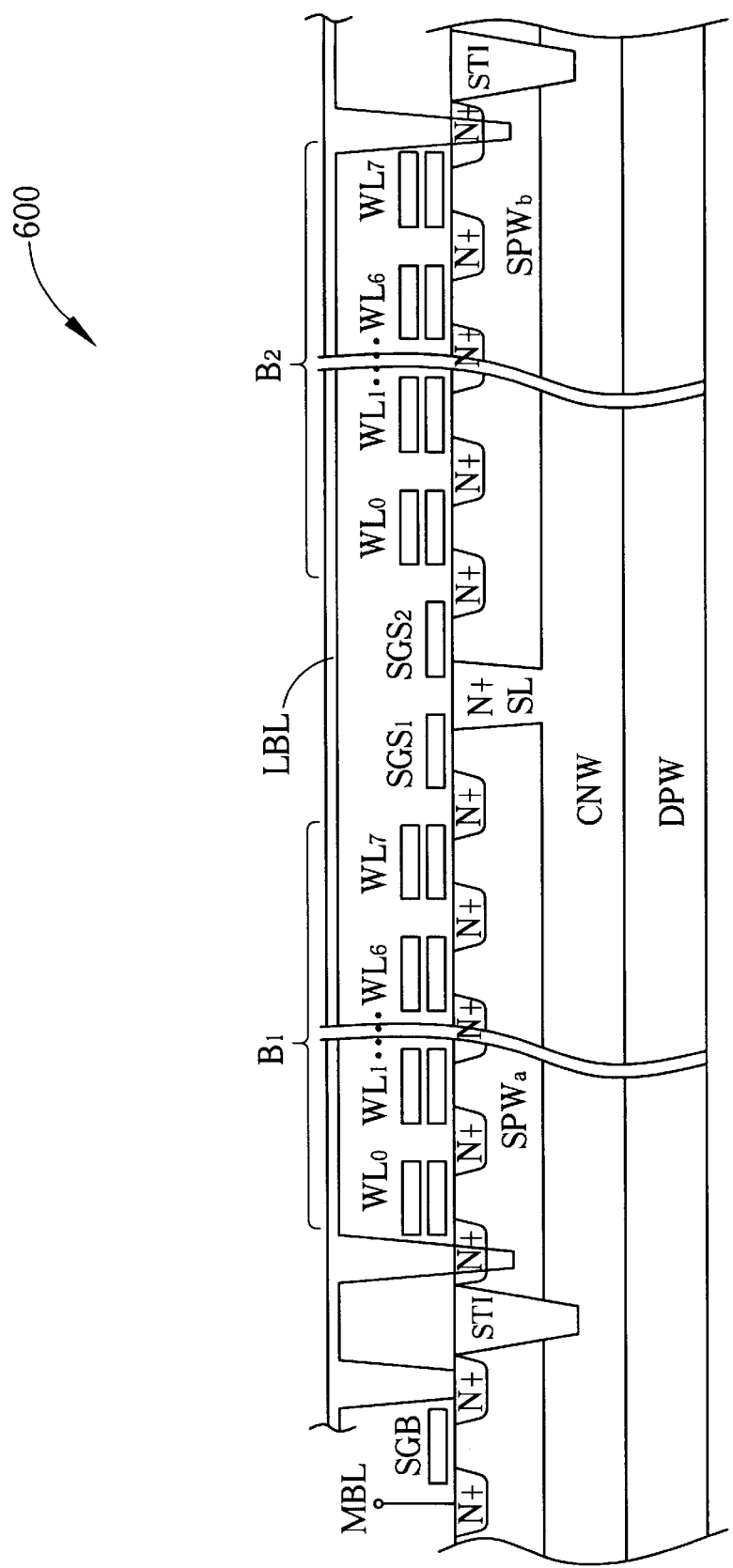
FIG. 6 depicts a portion of a low-voltage bi-directional FN write/erase EEPROM in a cross-sectional view according to the third preferred embodiment of this invention in which only two serially connected NAND memory cell blocks $B_1$ and $B_2$ are illustrated.

Referring to FIG. 6, a portion of a low-voltage bi-directional FN write/erase EEPROM 600 is shown in a cross-sectional view according to the third preferred embodiment of this invention in which only two serially connected NAND memory cell blocks $B_1$ and $B_2$ are illustrated for the sake of simplicity. As shown in FIG. 6, the EEPROM 600 comprises a DPW, a CNW, a plurality of columns of SPWs. Each of the plural columns of SPWs, which serve as a buried local bit line during operations, is isolated from each other with STI regions. The thickness of the STI layer is greater than the well depth of the shallow P-wells. A plurality of NAND cell blocks serially connected in one column are provided. A LBL overlies the column of NAND cell blocks. Each NAND memory cell block $B_1$ and $B_2$ comprises a plurality of floating gate memory cells ($M_0 \sim M_7$) connected in series manner. Likewise, each of the memory cells ($M_0 \sim M_7$) has a stacked gate structure, i.e., upper word lines ($WL_0 \sim WL_7$) and floating gates. A source line selection transistor (SGS1) is disposed at one end of the NAND cell block $B_1$. The SGS1 has one terminal electrically connected to the source of the NMOS memory transistor $M_7$ of the NAND cell block $B_1$ and another terminal electrically connected to a source line (SL) for controlling read signals. The source line is an N$^+$ deep doping region (N$^+$ SL) and is contiguous with the underlying CNW, thereby dividing the column of SPW into sub-wells (or sub-buried local bit lines): $SPW_a$ and $SPW_b$ corresponding to the NAND cell block $B_1$ and NAND cell block $B_2$ respectively. At the other end of the NAND cell block $B_1$, a contact plug is electrically connected with a drain of the NMOS memory transistor $M_0$ of the NAND cell block $B_1$. The contact plug penetrates a junction of the drain and the underlying sub-local buried bit line $SPW_a$, thereby short-circuiting the drain and the subjacent buried bit line $SPW_a$. The contact plug electrically connected to an overlying local bit line (LBL).

Figure 7:
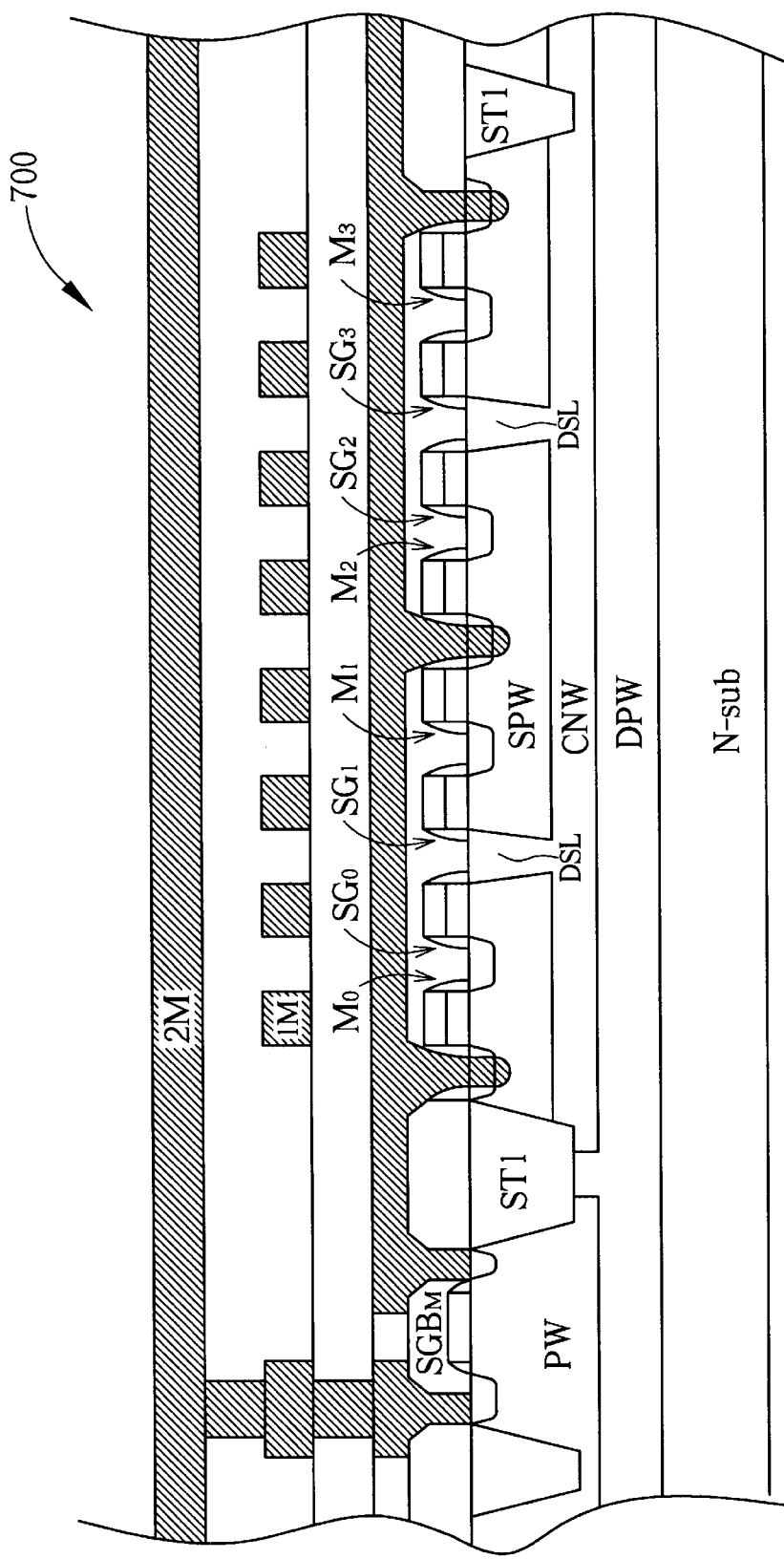
FIG. 7(a) and FIG. 7(b) are shown in a cross-sectional view a portion of an EEPROM, and a circuit arrangement of FIG. 7(a) according to the fourth preferred embodiment of this invention.
Figure 7:
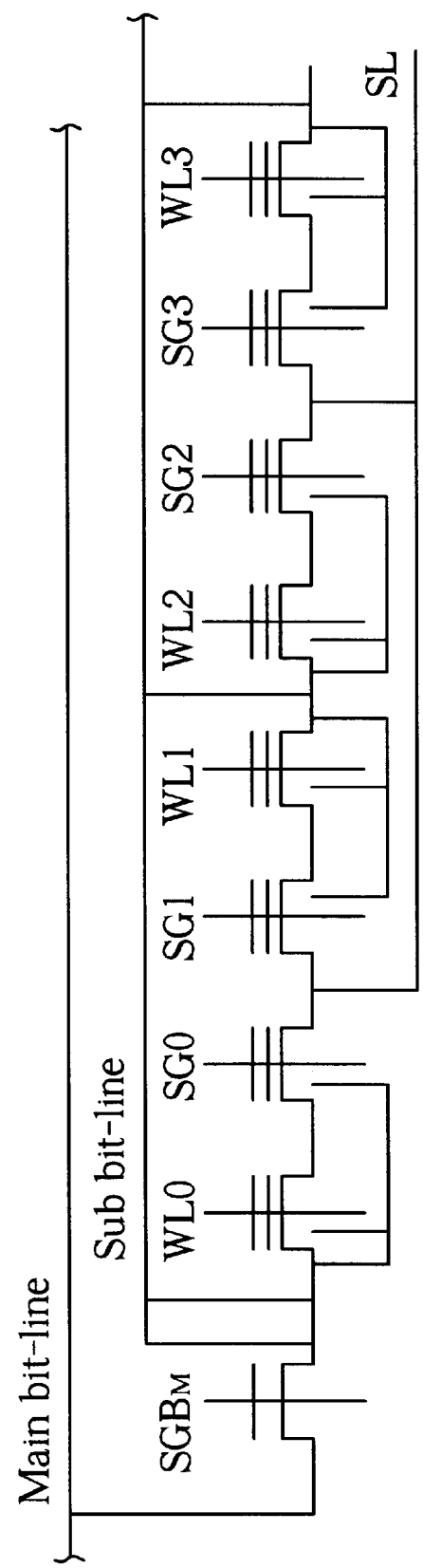

Referring to FIG. 7(a) and FIG. 7(b), a cross-sectional view a portion of an EEPROM 700 and a circuit arrangement of FIG. 7(a) are respectively shown according to the fourth preferred embodiment of this invention. As shown in FIG. 7(a), the EEPROM 700, which is based on a novel low-voltage bi-directional FN write/erase two-transistor NOR (2T-BiNOR) type flash memory array architecture, comprises a DPW, a CNW, a plurality of columns of shallow P-wells (SPW), a plurality of 2T memory units arranged in series on the SPW, and an LBL overlying the column of 2T memory units. Each of the plural columns of SPWs, which serve as a buried local bit line during operations, is isolated from each other with the STI regions. The thickness of the STI layer is greater than the well depth of the shallow P-wells. Each 2T memory unit comprises a memory transistor M (only $M_0 \sim M_3$ are shown) and a selection transistor SG (only $SG_0 \sim SG_3$ are shown). In this embodiment, the memory transistor M and the selection transistor SG have a similar stacked gate structure including a word line and a floating gate. It is noted that the word line and floating gate of the selection transistor sustain same voltage level during operation by electrically connecting the word line with the floating gate. The source of the memory transistor M is electrically connected to one terminal of the selection transistor SG. The drain of the memory transistor M is penetrated by a contact plug, as specifically indicated in this figure, which extends downward to the SPW, thereby short-circuiting the drain of the memory transistor M and the SPW. The source of the selection transistor SG is preferably an N$^+$ deep doping region or deep source line (DSL), which is contiguous with the subjacent CNW. Each isolated SPW is further divided into separate sub-SPW segments by the DSL. As shown in FIG. 7(b), a main bit line selection transistor $SGB_M$ is disposed between the main bit line and the local bit line on a P-well (PW) and is used to control signals from the main bit line to the local bit line. The selection transistor SG of the memory unit is used to control signals from the source lines (DSL). With such configuration, the EEPROM 700 of this invention is capable of implementing unique low-voltage and random access FN write/erase operations.

Figure 8:
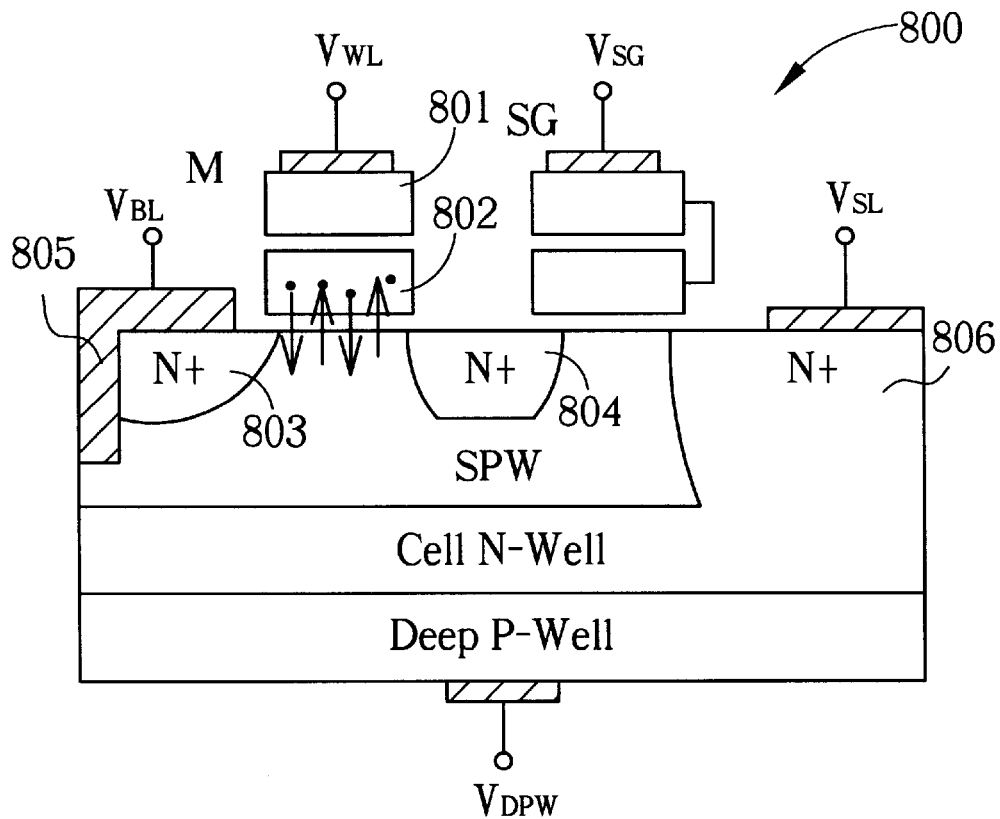
FIG. 8(a) and FIG. 8(b) is a cross-sectional schematic diagram illustrating a 2T-BiNOR EEPROM unit and exemplary operation modes thereof (erase, program, and read operations, respectively) according to the fourth preferred embodiment of this invention.

Referring to FIG. 8(a) and FIG. 8(b), a cross-sectional schematic diagram illustrating a 2T-BiNOR EEPROM unit 800 and exemplary operation modes thereof (erase, program, and read operations, respectively) are shown according to the fourth preferred embodiment of this invention. As mentioned, the 2T-NOREEPROM unit 800 is fabricated on an isolated column of SPW that serves as a buried bit line. The LBL is electrically connected to the SPW through a contact plug that penetrates the junction between the drain of the memory transistor M and the SPW. As shown in FIG. 8(a), in operation, a word line voltage $V_{WL}$ is applied to the control gate 801 of the memory transistor M, a bit line voltage $V_{BL\ is\ applied\ to\ the\ N+}$ drain 803. Since the SPW and the drain 803 are short-circuited together by using a plug 805, the voltage of the SPW and the voltage of the drain 803 are the same. The N$^+$ source 804 of the memory transistor M is serially connected to the selection transistor SG. The floating gate 802 of the memory transistor M is kept in a floating status. The control gate and floating gate of the selection transistor SG sustain same voltage level during operation by electrically connecting the word line with the floating gate. A gate voltage $V_{SG}$ is applied to the control gate of the selection transistor SG. A source line voltage $V_{SL\ is\ applied\ to\ the\ N+}$ source 806 of the selection transistor SG, which is an N+ deep source line (DSL) and is contiguous with the subjacent cell N-well. A well voltage $V_{DPW}$ is applied to the DPW.

As shown in FIG. 8(b), during an erase operation, $V_{BL}$ is floating, $V_{WL}$=10V, $V_{SL}$=−8V, $V_{SG}$=−6V, $V_{DPW}$=−8V. Under this condition, electrons are injected into and trapped in the floating gate 802 by FN tunneling through an oxide layer between the floating gate 802 and the SPW, thereby adjusting the memory cell 800 to a higher threshold voltage (higher $V_{TH}$) state, for example, in a range like 1.5V<$V_{TH}$<3.5V. When implementing a program operation, $V_{BL}$=5V, $V_{WL}$=−10V, $V_{SL}$ is floating, $V_{DPW}$=0V, $V_{SG}$=0V. Under this condition, trapped electrons in the floating gate 802 are repelled out by FN tunneling, thereby adjusting the memory cell 800 to a lower threshold voltage (lower $V_{TH}$) state, for example, in a range like $V_{TH}$<−1V. When implementing a read operation, $V_{BL}$=0V, $V_{WL}$=0V, $V_{SL}$=1.5V, $V_{DPW}$=0V, and $V_{SG}$=5V.

Figure 9:
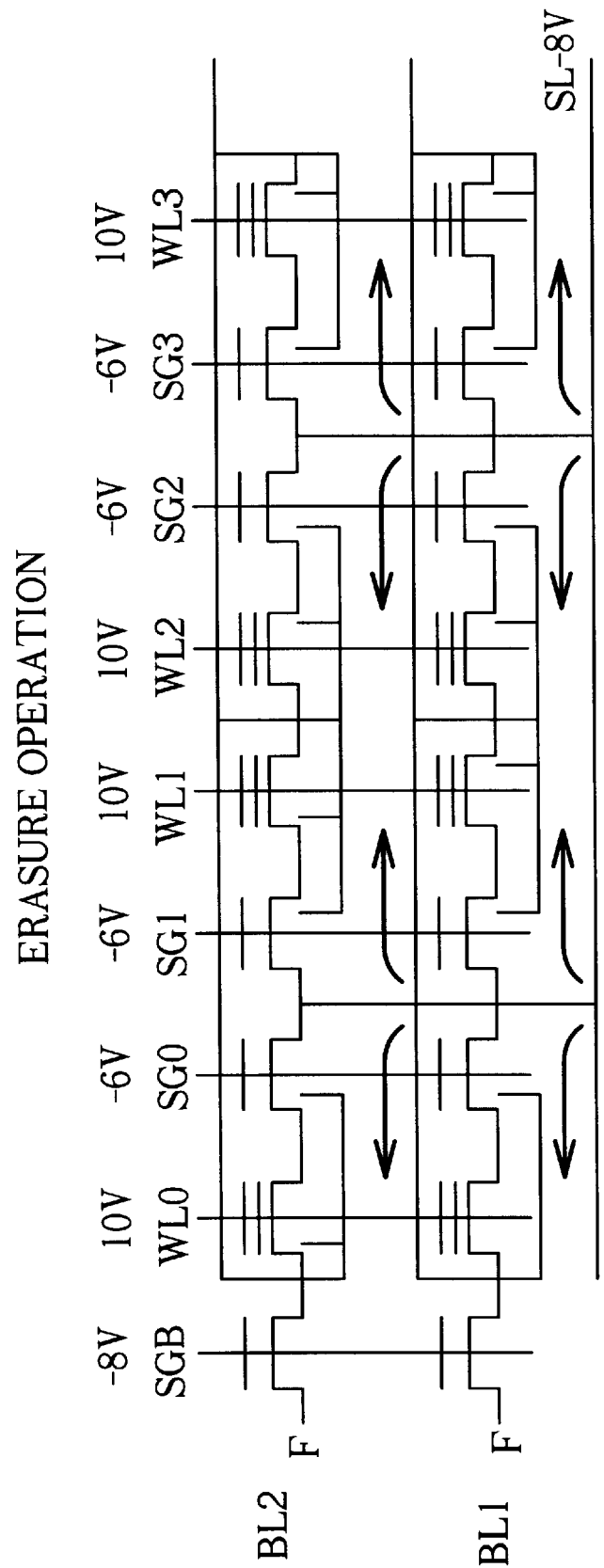
FIG. 9(a) to FIG. 9(c) are a segmental circuit arrangement of the 2T-BiNOR-EEPROM and exemplary operation modes thereof (erase, program, and read operations, respectively) according to the fourth preferred embodiment of this invention.
Figure 9:
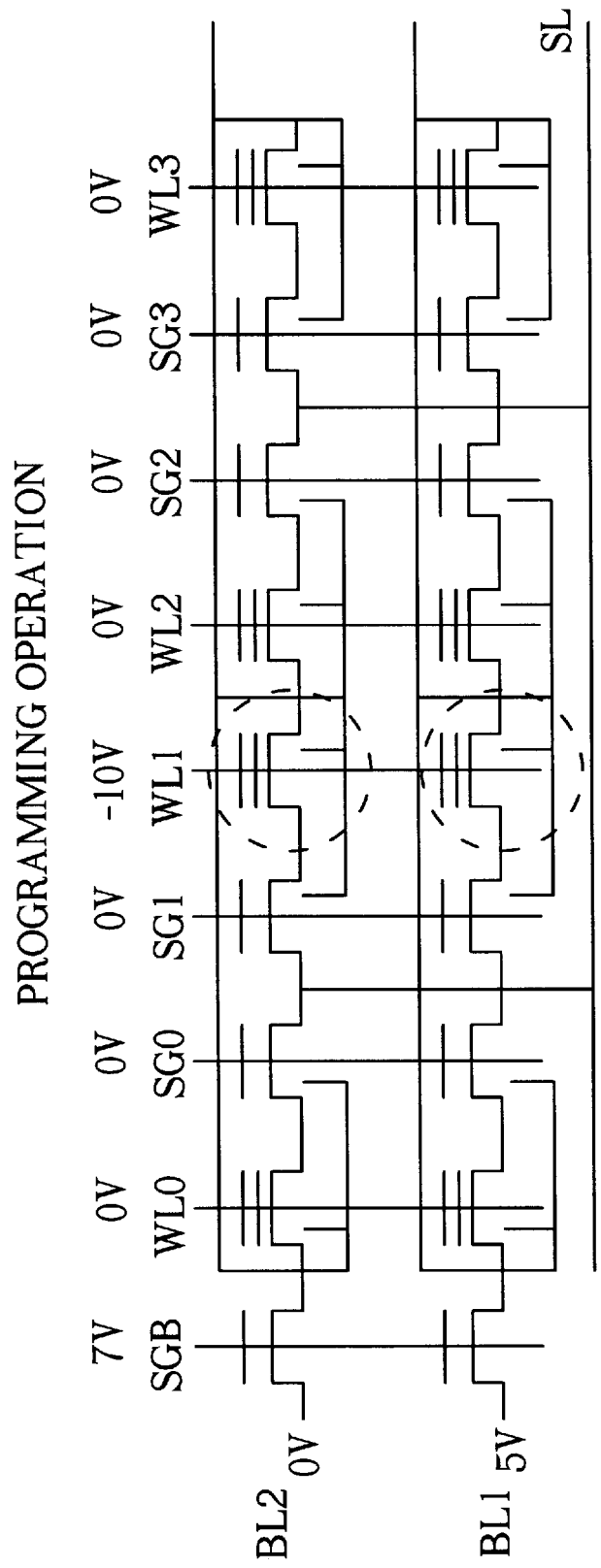
Figure 9:
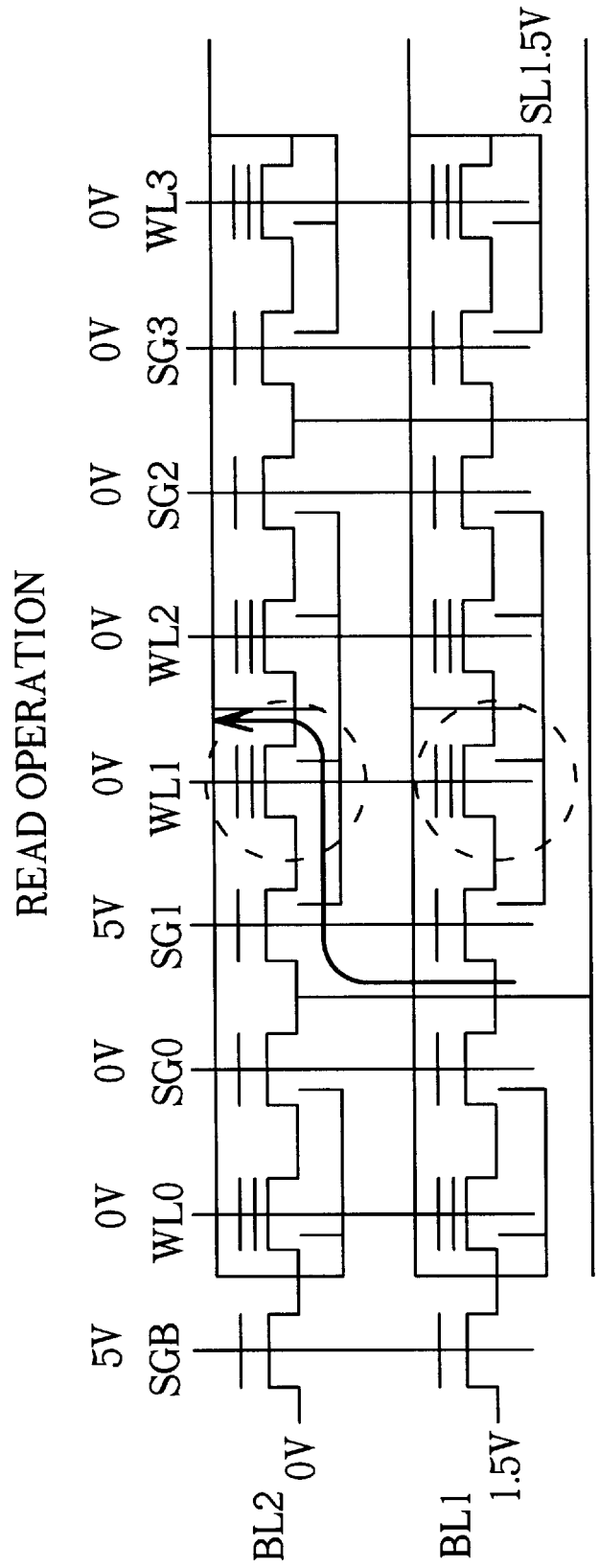

Referring to FIG. 9(a) to FIG. 9(c), a segmental circuit arrangement of the 2T-BiNOR-EEPROM and exemplary operation modes thereof (erase, program, and read operations, respectively) are shown according to the fourth preferred embodiment of this invention. As shown in FIG. 9(a), during an erase operation, all of the word lines (only $WL_0$~$WL_3$ are shown) are applied with a word line voltage of 10V, and $V_{PDW}$=−8V. All of the bit lines (only $BL_1$ and $BL_2$ are shown) are floating. Source lines (SL) are applied with a source line voltage of 8V. A gate voltage of 6V is applied to the control gate of the source line selection transistor SG (only $SG_0$~$SG_3$ are shown). A gate voltage of 8V is applied to the control gate of the bit line selection transistor SGB. Under this condition, electrons are injected into the floating gates of all of the memory transistors through the FN tunneling mechanism so as to adjust the threshold voltage ($V_{TH}$) of each of the memory cells to a relatively high $V_{TH}$ state, preferably, in a range of 1.5V<$V_{TH}$<3.5V.

As shown in FIG. 9(b), during a data program operation, a word line voltage of 10V is applied to the control gate of a selected word line $WL_1$, by way of example. A word line voltage of 0V is applied to the non-selected word lines, i.e., $WL_0$, $WL_2$ and $WL_3$. $V_{PDW}$=0V. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. A gate voltage of 0V is applied to the control gate of the source line selection transistor SG. Under this condition, electrons are repelled out of the floating gate of the selected memory transistor through the FN tunneling mechanism so as to adjust the threshold voltage ($V_{TH}$) of each of the memory cells to a relatively low $V_{TH}$ state, preferably, $V_{TH}$<−1V.

As shown in FIG. 9(c), during a data read operation, a word line voltage of 0V is applied to the control gate of a selected word line $WL_1$, by way of example. A gate voltage of 5V is applied to the control gate of a selection transistor connected to the selected memory transistor. A word line voltage of 0V is applied to those non-selected word lines, i.e., $WL_0$, $WL_2$, and $WL_3$ so as to conduct channels thereof. A gate voltage of 0V is applied to those non-selected selection transistors $SG_0$, $SG_2$, $SG_3$. A source line voltage of 1.5V is applied to the source lines (SL). A bit line voltage of 0V is applied to a selected bit line $BL_2$. A bit line voltage of 1.5V is applied to those non-selected bit lines (only one non-selected bit line ($BL_1$) is shown). A gate voltage of 5V is applied to the control gate of the bit line selection transistor SGB.

Figure 10:
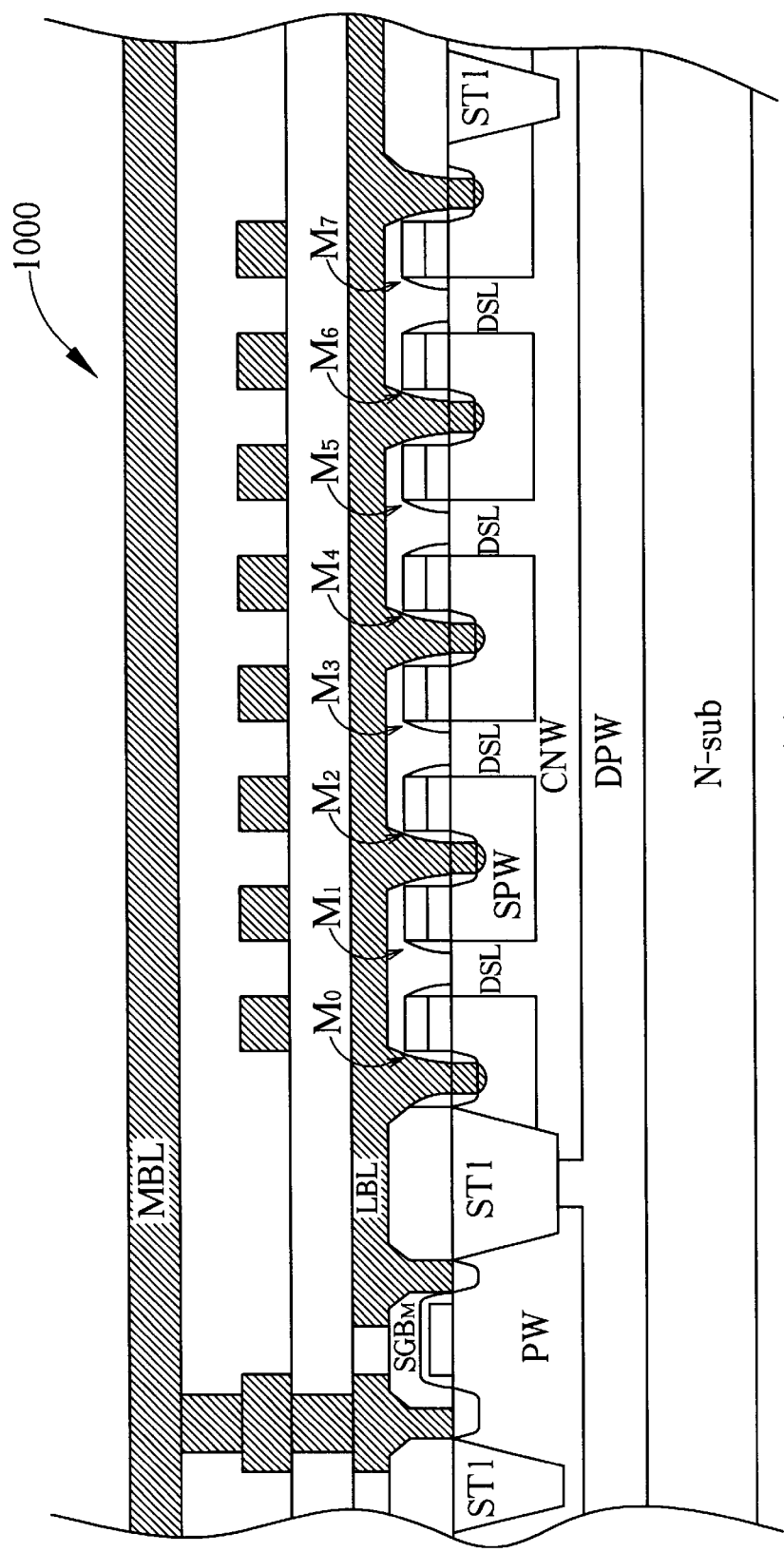
FIG. 10(a) and FIG. 10(b) are an EEPROM in a cross-sectional view and corresponding equivalent circuit according to the fifth preferred embodiment of the present invention.
Figure 10:
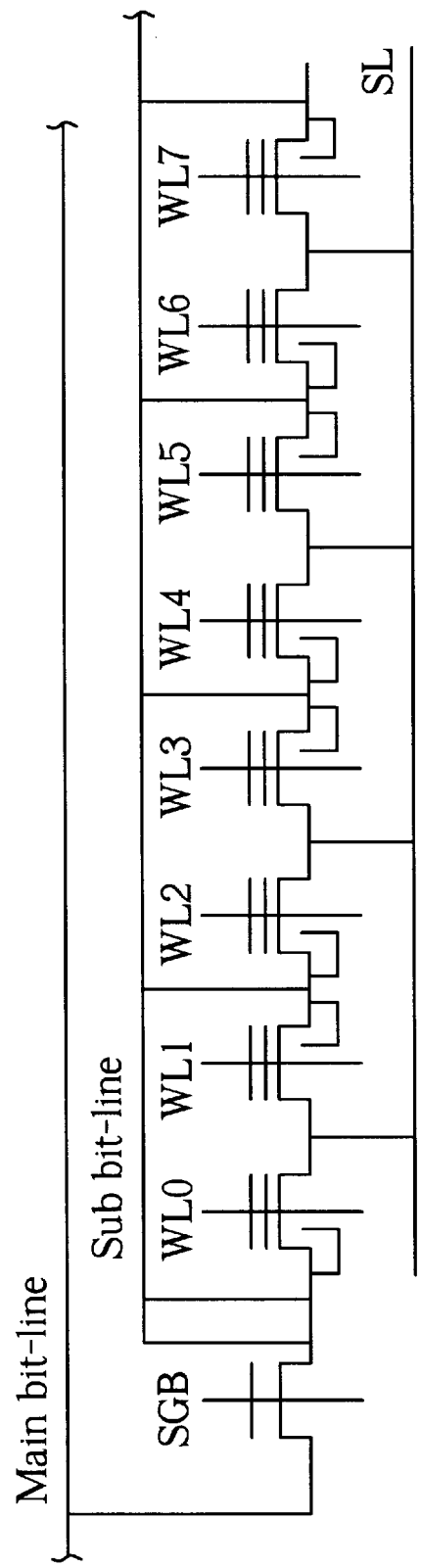

Referring to FIG. 10(a) and FIG. 10(b), an EEPROM 1000 in a cross-sectional view and corresponding equivalent circuit according to the fifth preferred embodiment of the present invention are illustrated. Compared to the fourth embodiment of this invention, the fifth preferred embodiment of this invention has no selection transistors (SG) formed on the SPW in the memory array. Consequently, it is particularly suited for high-density data flash memory. As shown in FIG. 10(a), EEPROM 1000, which is based on a novel low-voltage bi-directional FN write/erase NOR type (BiNOR) flash memory array architecture, comprises a DPW formed on an N-substrate, a CNW formed on the DPW, columns of isolated SPW formed within the CNW, a plurality of memory cells ($M_0$~$M_7$) formed on the SPW, and a local bit line LBL overlying the memory cells ($M_0$~$M_7$). Each memory cell ($M_0$~$M_7$) has a stacked gate structure, i.e., upper word lines ($WL_0$~$WL_7$) and floating gates. The source of each of the memory cells ($M_0$~$M_7$) is an N+ deep doping region (DSL) and is contiguous with the underlying CNW, thereby dividing the column of SPW into sub-wells. The drain of each of the memory cells ($M_0$~$M_7$) is penetrated by a contact plug, which extends downward to the SPW, thereby short-circuiting the drain and the SPW. As shown in FIG. 10(b), a main bit line-selection transistor SGB is disposed between the main bit line and the local bit line and is used to control signals from the main bit line to the local bit line. With such configuration, the EEPROM 1000 of this invention is capable of implementing unique low-voltage and random access FN write/erase operations.

Figure 11:
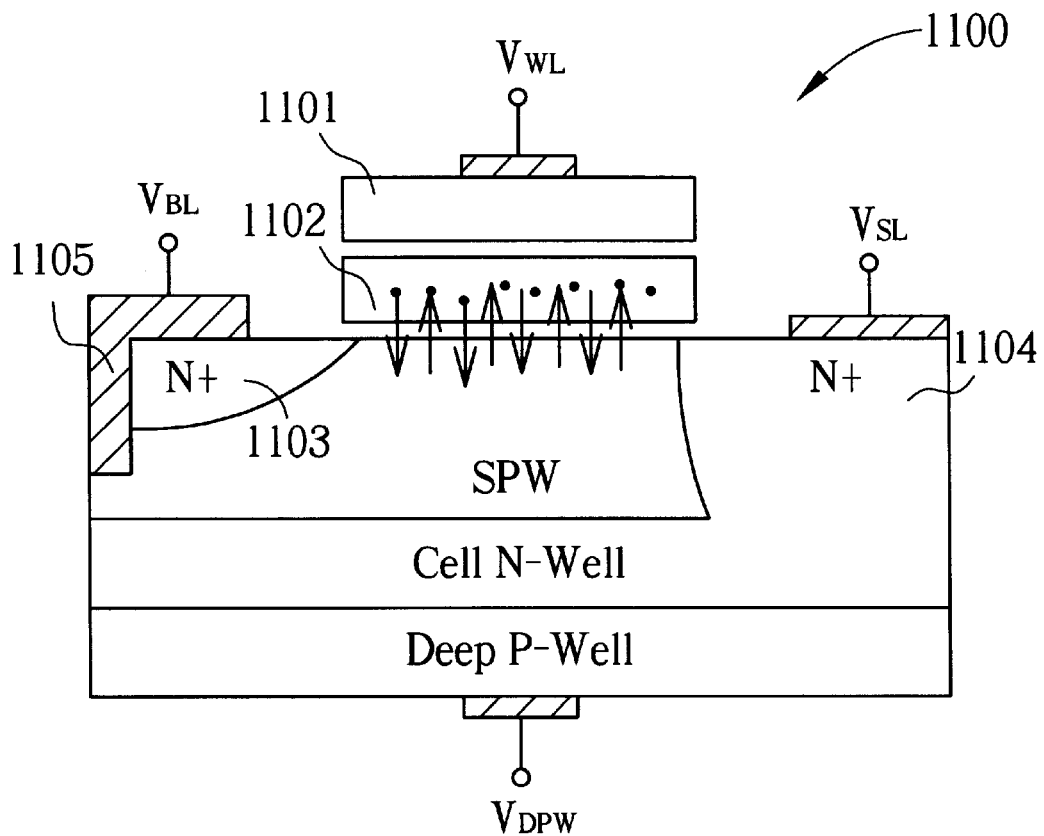
FIG. 11(a) and FIG. 11(b) are a cross-sectional schematic diagram illustrating a BiNOR EEPROM cell and exemplary operation modes thereof (erase, program, and read operations, respectively) according to the fifth preferred embodiment of this invention.

Referring to FIG. 11(a) to FIG. 11(c), a cross-sectional schematic diagram illustrating a BiNOR EEPROM cell 1100 and exemplary operation modes thereof (erase, program, and read operations, respectively) are shown according to the fifth preferred embodiment of this invention. As mentioned, the BiNOR EEPROM unit 1100 is fabricated on an isolated column of SPW that serves as a buried bit line. The LBL is electrically connected to the SPW through a contact plug that penetrates the junction between the drain of the memory cell and the subjacent SPW. As shown in FIG. 11(a), in operation, a word line voltage $V_{WL}$ is applied to the control gate 1101 of the memory transistor 1100, a bit line voltage $V_{BL\ is\ applied\ to\ the\ N+}$ drain 1103. Since the SPW and the drain 1103 are short-circuited together by using a plug 1105, the voltage of the SPW and the voltage of the drain 1103 are the same. A source voltage V is applied to the N+ source 1104 of the memory transistor 1100. The N+ source 1104 is an N+ deep doping region and is contiguous with the subjacent cell N-well. The floating gate 1102 of the memory transistor 1100 is kept in a floating status. A well voltage $V_{DPW}$ is applied to the deep P-well.

As shown in FIG. 11(b), during an erase operation, $V_{BL}$ is floating, $V_{WL}$=10V, $V_{SL}$=−8V, $V_{DPW}$=−8V. Under this condition, electrons are injected into and trapped in the floating gate 1102 by FN tunneling through an oxide layer between the floating gate 1102 and the SPW, thereby adjusting the memory cell 1100 to a higher threshold voltage (higher $V_{TH}$) state, for example, $V_{TH}$>6V. When implementing a program operation, $V_{BL}$=5V $V_{WL}$=−10V, $V_{SL}$ is floating, $V_{DPW}$=0V. Under this condition, trapped electrons in the floating gate 1102 are repelled out by FN tunneling, thereby adjusting the memory cell 1100 to a lower threshold voltage (lower $V_{TH}$) state, for example, in a range like 1V<$V_{TH}$<2V. When implementing a read operation, $V_{BL}$=0V, $V_{WL}$=4V, $V_{SL}$=1.5V, $V_{DPW}$=0V.

Figure 12:
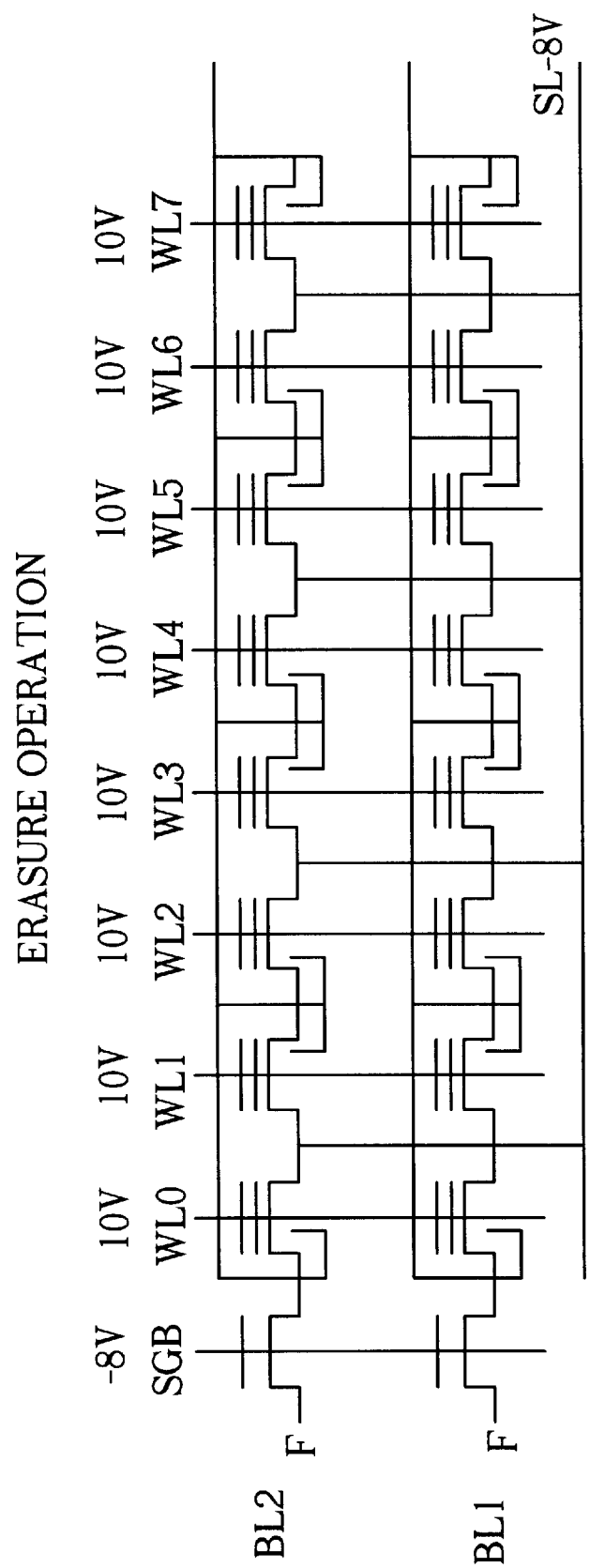
FIG. 12(a) to FIG. 12(c) are segmental circuit arrangement of the BiNOR EEPROM and exemplary operation modes thereof (erase, program, and read operations, respectively) according to the fifth preferred embodiment of this invention.
Figure 12:
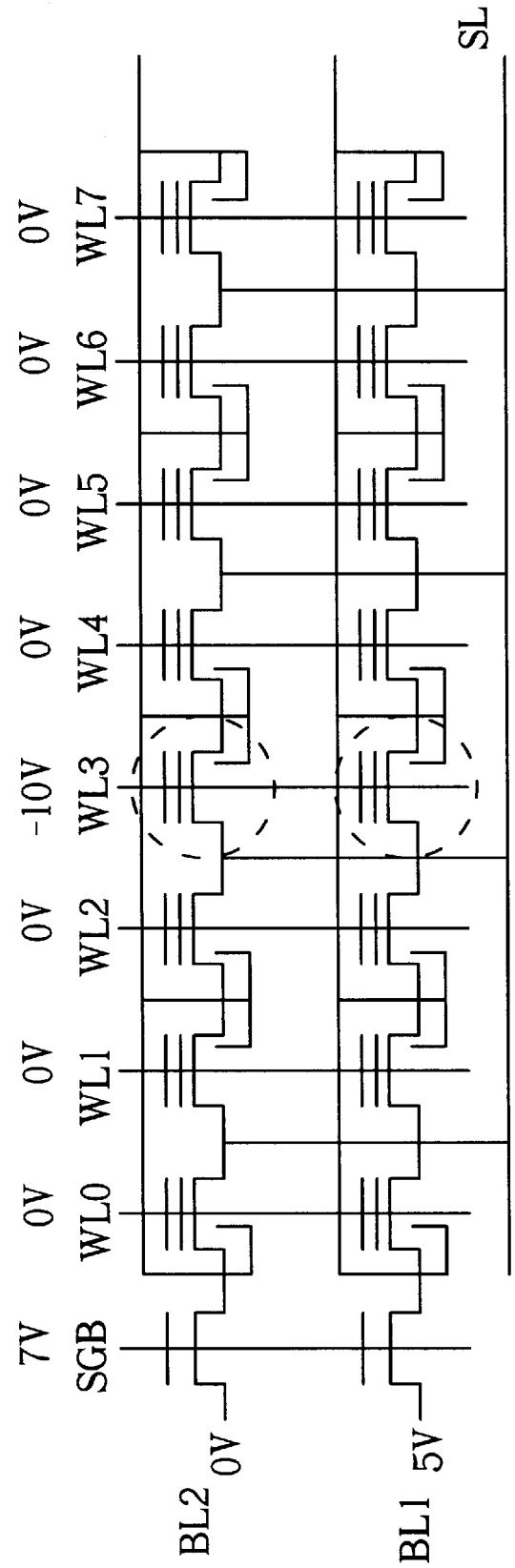
Figure 12:
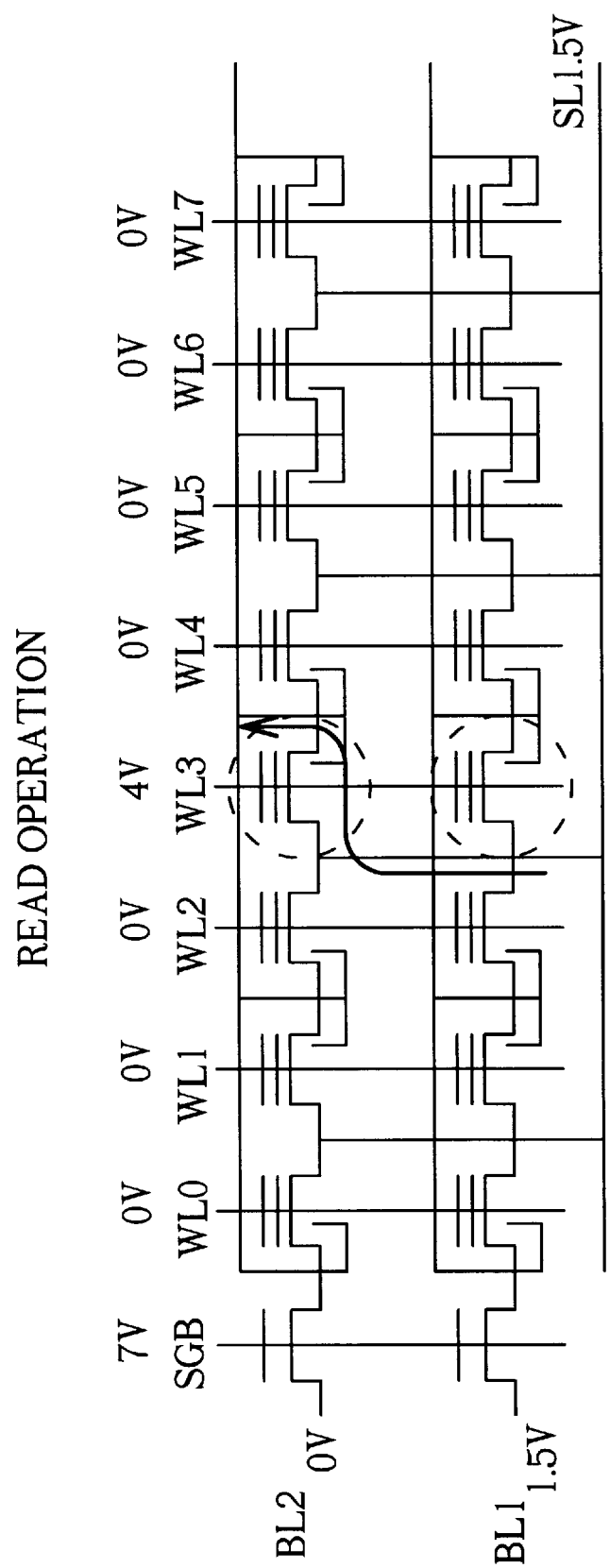

Referring to FIG. 12(a) to FIG. 12(c), a segmental circuit arrangement of the BiNOR EEPROM and exemplary operation modes thereof (erase, program, and read operations, respectively) are shown according to the fifth preferred embodiment of this invention. As shown in FIG. 12($a$), during an erase operation, all of the word lines ($WL_0 \sim WL_7$) are applied with a word line voltage of 10V, and $V_{PDW}=-8V$. All of the bit lines (only $BL_1$ and $BL_2$ are shown) are floating. Source lines (SL) are applied with a source line voltage of -8V. A gate voltage of 8V is applied to the control gate of the bit line selection transistor SGB. Under this condition, electrons are injected into the floating gates of all of the memory transistors through the FN tunneling mechanism so as to adjust the threshold voltage ($V_{TH}$) of each of the memory cells to a relatively high $V_{TH}$ state, preferably, $V_{TH}>6V$.

As shown in FIG. 12($b$), during a data program operation, a word line voltage of 10V is applied to the control gate of a selected word line $WL_3$, by way of example. A word line voltage of 0V is applied to the non-selected word lines, i.e., $WL_0 \sim WL_2$ and $WL_4 \sim WL_7$. $V_{PDW}=0V$. A bit line voltage of 5V is applied to a selected bit line $BL_1$. Non-selected bit lines (only one non-selected bit line $BL_2$ is shown) are grounded. The source line (SL) is kept in a floating status. A gate voltage of 7V is applied to the control gate of the bit line selection transistor SGB. Under this condition, electrons are repelled out of the floating gate of the selected memory transistor through the FN tunneling mechanism so as to adjust the threshold voltage ($V_{TH}$) of each of the memory cells to a relatively low $V_{TH}$ state, preferably, $1V<V_{TH}<2V$.

As shown in FIG. 12($c$), during a data read operation, a word line voltage of 4V is applied to the control gate of a selected word line $WL_3$, by way of example. A word line voltage of 0V is applied to those non-selected word lines $WL_0 \sim WL_2$ and $WL_4 \sim WL_7$. A source line voltage of 1.5V is applied to the source lines (SL). A bit line voltage of 0V is applied to a selected bit line $BL_2$. A bit line voltage of 1.5V is applied to those non-selected bit lines (only one non-selected bit line ($BL_1$) is shown). A gate voltage of 7V is applied to the control gate of the bit line selection transistor SGB.

Figure 13:
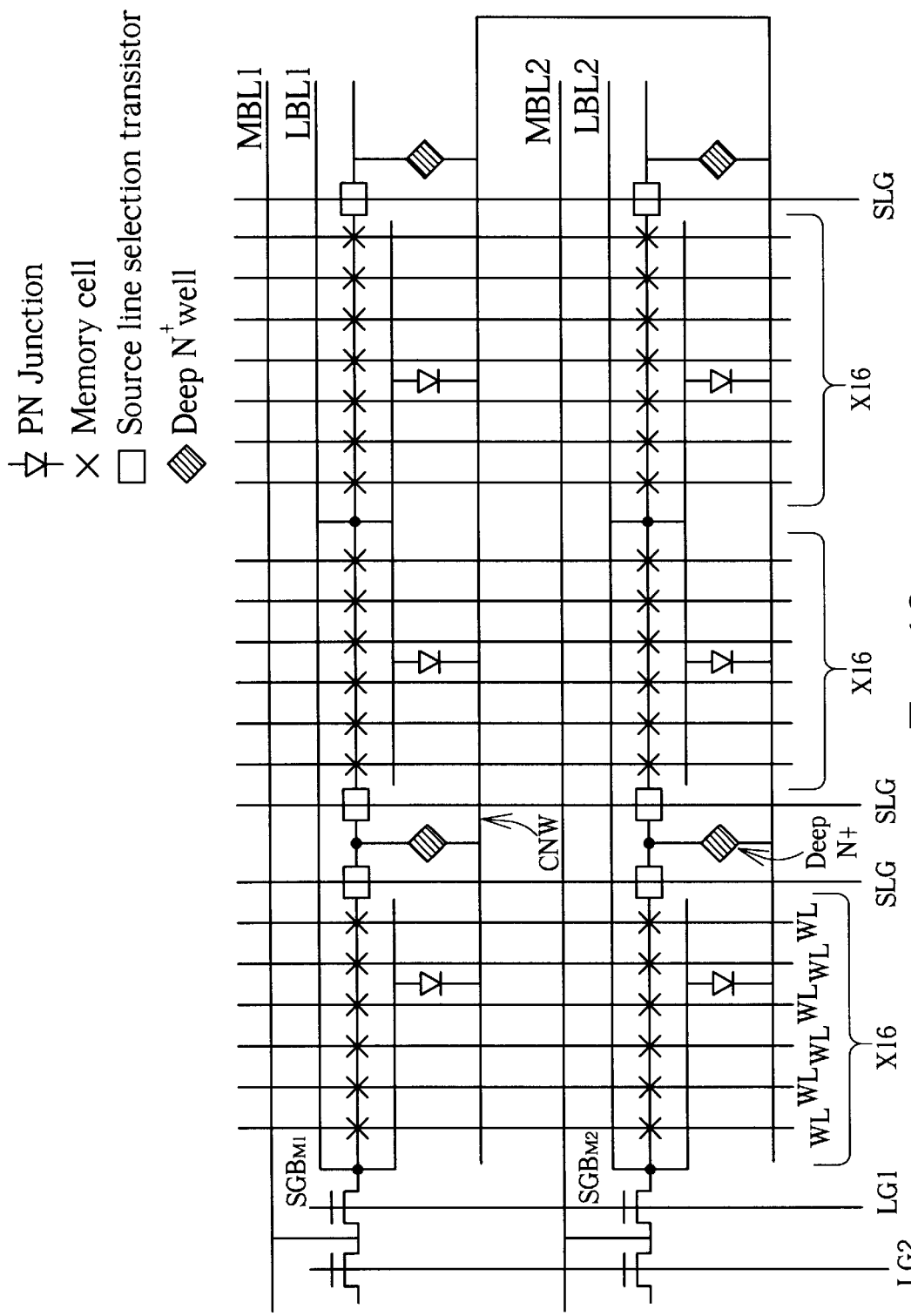
FIG. 13 and FIG. 14 illustrate other embodiments according to this invention.
Figure 14:
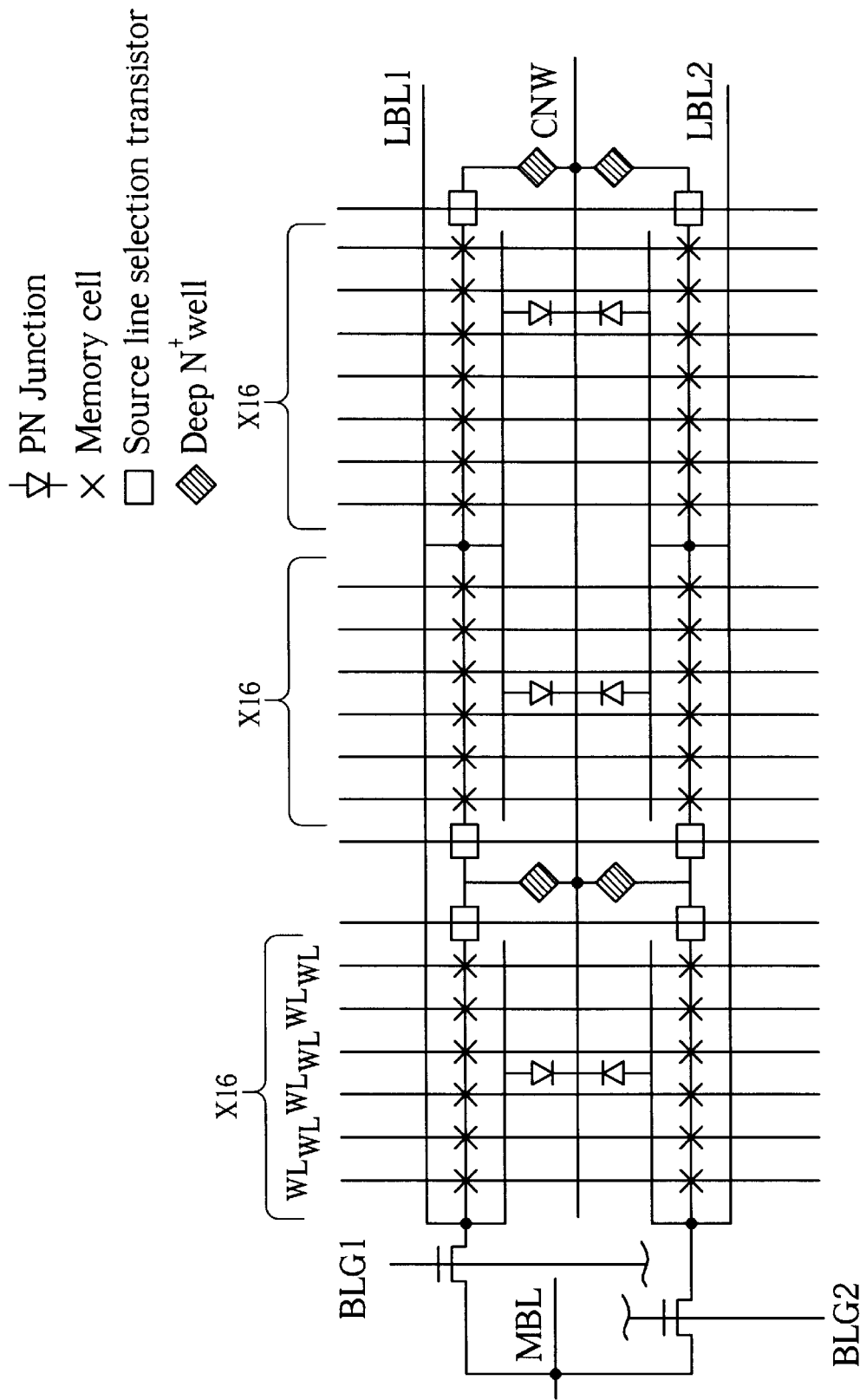

Referring to FIG. 13 and FIG. 14, other embodiments according to this invention are shown. In FIG. 13, a one-MBL-to-one-LBL layout is illustrated. Bit line signals from the MBL1 to the LBL1 are controlled by a $SGB_{M1}$. Bit line signals from the MBL2 to the LBL2 are controlled by a $SGB_{M2}$. In FIG. 14, a one-MBL-to-two-LBL layout is illustrated.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A low-voltage nonvolatile memory array, comprising:
   a substrate;
   a cell well of a first conductivity type formed in the substrate;
   columns of buried bit lines of a second conductivity type formed within the cell well, wherein the columns of the buried bit lines are isolated from each other and each of which is further divided into plurality of sub-bit line segments with deeply doped source wells of the first conductivity type connected to the cell well;
   a plurality of memory cell blocks serially arranged over one of the columns of buried bit lines, wherein a memory cell block corresponds to a sub-bit line segment, and each of the memory cell blocks comprises at least one memory transistor having a stacked gate, a source, and a drain; and
   a local bit line overlying the memory cell blocks and electrically connected to the drain of the memory transistor via a contact plug short-circuiting the drain and the subjacent buried bit line.

2. The low-voltage nonvolatile memory array of claim 1 wherein the columns of the buried bit lines are isolated from each other with shallow trench isolations.

3. The low-voltage nonvolatile memory array of claim 1 wherein the deeply doped source well of the first conductivity type serves as the source of the memory transistor.

4. The low-voltage nonvolatile memory array of claim 1 wherein the memory cell block further comprises a selection transistor having one end serially connected to the source of the memory transistor and the deeply doped source well serves as a source of the selection transistor.

5. The low-voltage nonvolatile memory array of claim 4 wherein the selection transistor has a floating gate electrically connected with an overlying control gate.

6. The low-voltage nonvolatile memory array of claim 1 wherein the contact plug penetrates a junction of the drain and the underlying buried bit line so as to provide the buried bit line with a bit line voltage.

7. The low-voltage nonvolatile memory array of claim 1 wherein the each of the memory cell blocks comprises a plurality of memory transistors serially connected to each other to form a NAND memory cell array.

8. The low-voltage nonvolatile memory array of claim 7 wherein n is an integer between 2 and 16 inclusive.

9. The low-voltage nonvolatile memory array of claim 1 wherein the first conductivity type is N type, and the second conductivity type is P type.

10. A nonvolatile memory device, comprising:
    a substrate;
    a cell well of a first conductivity type formed in the substrate;
    columns of buried bit lines of second conductivity type formed within the cell well, wherein the columns of the buried bit lines are isolated from each other and each of which is further divided into plurality of sub-bit line segments with deeply doped source wells of the first conductivity type connected to the cell well of first conductivity type;
    a plurality of memory cell blocks serially arranged over one of the columns of buried bit lines, wherein a memory cell block corresponds to a sub-bit line segment, and each of the memory cell blocks comprises at least one memory transistor having a control gate, a floating gate, a source, and a drain;
    rows of word lines, each of which connects to the control gate of one of the memory transistors;
    a local bit line overlying the memory cell blocks and electrically connected to the drain of the memory transistor via a contact plug short-circuiting the drain and the subjacent buried bit line; and
    columns of main bit lines.

11. The nonvolatile memory device of claim 10 wherein the columns of the buried bit lines are isolated from each other with shallow trench isolations.

12. The nonvolatile memory device of claim 10 wherein the deeply doped source well of first conductivity type serves as the source of the memory transistor.

13. The nonvolatile memory device of claim 10 wherein the memory cell block further comprises a selection transistor having one end serially connected to the source of the memory transistor and the deeply doped source well serves as a source of the selection transistor.

14. The nonvolatile memory device of claim 13 wherein the selection transistor has a stacked gate having a floating gate electrically connected with an overlying control gate.

15. The nonvolatile memory device of claim 10 wherein each of the memory cell blocks comprises a plurality of memory transistors serially connected to each other to form a NAND memory cell array.

16. A nonvolatile memory, comprising:

a substrate;

a cell well of a first conductivity type formed in the substrate;

columns of buried bit lines of a second conductivity type formed within the cell well, wherein the columns of the buried bit lines are isolated from each other;

a plurality of memory cell blocks serially arranged over one of the columns of buried bit lines, wherein each of the memory cell blocks comprises at least one memory transistor having a stacked gate, a source, and a drain; and a local bit line overlying the memory cell blocks and electrically connected to the drain of the memory transistor via a contact plug short-circuiting the drain and the subjacent buried bit line.

17. The nonvolatile memory of claim 16 wherein each of the columns of buried bit lines is further divided into plurality of sub-bit line segments with deeply doped source wells of the first conductivity type connected to the cell well.

18. The nonvolatile memory of claim 17 wherein a memory cell block corresponds to a sub-bit line segment.

19. The nonvolatile memory of claim 17 wherein the deeply doped source well of the first conductivity type serves as the source of the memory transistor.

20. The nonvolatile memory of claim 16 wherein the columns of the buried bit lines are isolated from each other with shallow trench isolations.

21. The nonvolatile memory of claim 16 wherein the memory cell block further comprises a selection transistor having one end serially connected to the source of the memory transistor.

* * * * *